US006780563B2

(12) United States Patent
Hasegawa et al.

(10) Patent No.: US 6,780,563 B2
(45) Date of Patent: Aug. 24, 2004

(54) POLYMER, RESIST COMPOSITION AND PATTERNING PROCESS

(75) Inventors: Koji Hasegawa, Nakakubiki-gun (JP); Takeshi Kinsho, Nakakubiki-gun (JP); Takeru Watanabe, Nakakubiki-gun (JP); Mutsuo Nakashima, Nakakubiki-gun (JP); Seiichiro Tachibana, Nakakubiki-gun (JP); Tsunehiro Nishi, Nakakubiki-gun (JP); Jun Hatakeyama, Nakakubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 183 days.

(21) Appl. No.: 09/963,465

(22) Filed: Sep. 27, 2001

(65) Prior Publication Data

US 2002/0061465 A1 May 23, 2002

(30) Foreign Application Priority Data

Sep. 27, 2000 (JP) ........................................ 2000-293858

(51) Int. Cl.[7] .......................... G03F 7/039; C08F 30/08
(52) U.S. Cl. .................... 430/270.1; 430/313; 430/323; 526/271; 526/270; 526/279
(58) Field of Search .............................. 430/270.1, 313, 430/323, 327, 330, 905, 910; 526/271, 270, 279, 280

(56) References Cited

U.S. PATENT DOCUMENTS

| | | | | |
|---|---|---|---|---|
| 5,580,694 A | * | 12/1996 | Allen et al. | 430/270.1 |
| 5,985,524 A | * | 11/1999 | Allen et al. | 430/326 |
| 6,045,970 A | * | 4/2000 | Choi | 430/270.1 |
| 6,063,543 A | * | 5/2000 | Hien et al. | 430/270.1 |
| 6,103,448 A | * | 8/2000 | Kim et al. | 430/270.1 |
| 6,165,682 A | * | 12/2000 | Foster et al. | 430/270.1 |
| 6,210,856 B1 | * | 4/2001 | Lin et al. | 430/270.1 |
| 6,444,408 B1 | * | 9/2002 | Brock et al. | 430/322 |
| 6,506,535 B1 | * | 1/2003 | Mizutani et al. | 430/270.1 |

FOREIGN PATENT DOCUMENTS

| | | | | |
|---|---|---|---|---|
| JP | 7-118651 A | | 5/1995 | |
| JP | 9-110938 A | | 4/1997 | |
| JP | 2001166482 A | * | 6/2001 | ........... G03F/7/039 |
| JP | 2001194787 A | * | 7/2001 | ........... G03F/7/039 |
| JP | 2001194788 A | * | 7/2001 | ........... G03F/7/039 |
| JP | 2001194789 A | * | 7/2001 | ........... G03F/7/039 |
| JP | 2001226432 A | * | 8/2001 | ........... C08F/30/08 |

OTHER PUBLICATIONS

W. Brunsvold, et al., "Evaluation of a Deep UV Bilayer Resist for Sub–Half Micron Lithography", pp. 377–387.
Carl R. Kessel, et al., "Novel Silicon–Containing Resists for EUV and 193 nm Lithography", Mar. 1999, pp. 214–220.
Qinghuang Lin, et al., "A High Resolution 248 nm Bilayer Resist", Mar. 1999, pp. 241–250.
Larry D. Boardman, et al., "Chemical Aspects of Silicon–Containing Bilayer Resists", Mar. 1999, pp. 562–572.
Jin–Beak Kim, et al., "Chemically amplified resist based on the methacrylate polymer with 2–trimethylsilyl–2–propyl ester protecting group", Mar. 1999, p. 420–428.
SPIE vol. 1925 (1993) p. 377–387.
SPIE vol. 3678 (1999) p. 214–220, p. 241–250, p. 562–572, p. 420–428.

* cited by examiner

*Primary Examiner*—Yvette C. Thornton
(74) *Attorney, Agent, or Firm*—Millen, White, Zelano & Branigan, P.C.

(57) ABSTRACT

A polymer bearing specific silicon-containing groups is novel. A resist composition comprising the polymer as a base resin is sensitive to high-energy radiation and has excellent sensitivity and resolution at a wavelength of less than 300 nm, and high resistance to oxygen plasma etching. The resist composition lends itself to micropatterning for the fabrication of VLSIs.

20 Claims, No Drawings

POLYMER, RESIST COMPOSITION AND PATTERNING PROCESS

This invention relates to polymers suitable as the base resin in chemically amplified positive resist compositions used for micropatterning in a process for the fabrication of semiconductor devices. It also relates to chemically amplified positive resist compositions adapted for exposure to high-energy radiation such as deep-UV, KrF excimer laser light (248 nm), ArF excimer laser light (193 nm), electron beams or x-rays and a process for forming a pattern.

BACKGROUND OF THE INVENTION

While a number of recent efforts are being made to achieve a finer pattern rule in the drive for higher integration and operating speeds in LSI devices, the commonly used light exposure technology is approaching the essential limit of resolution determined by the light source wavelength. For the light exposure using g-line (436 nm) or i-line (365 nm), a pattern rule of about 0.5 µm is thought to be the limit. The LSI fabricated using such light exposure has a maximum degree of integration corresponding to 16 M-bit dynamic random access memory (DRAM). However, the laboratory fabrication of LSI already reached this stage, and the development of a further micropatterning technology is in urgent demand.

One means for reducing the pattern size is to reduce the wavelength of exposure light used in forming a resist pattern. For the mass production process of 256 M-bit DRAM (processing size up to 0.25 µm), it is now under intensive consideration to replace i-line (365 nm) as the exposure light source by KrF excimer laser light of a shorter wavelength of 248 nm. However, for the fabrication of DRAM with a degree of integration of 1 G or more requiring a finer patterning technology (processing size up to 0.2 µm), a shorter wavelength light source is required, and in particular, photolithography using ArF excimer laser light (193 nm) is now under investigation.

Since H. Ito, G. C. Willson et al of IBM proposed a chemically amplified positive resist composition comprising a resin in the form of polyhydroxystyrene having hydroxyl groups blocked with tert-butoxycarbonyloxy (tBOC) groups, that is, poly(4-t-butoxycarbonyloxystyrene) (PBOCST) and a photoacid generator in the form of an onium salt, a number of resist compositions having a high sensitivity and resolution have been developed. These chemically amplified positive resist compositions all have a high sensitivity and resolution, but are difficult to form fine patterns with a high aspect ratio because the patterns' strength is low.

A number of chemically amplified positive resist compositions using the above-mentioned polyhydroxystyrene as the base resin and having sensitivity to deep-UV, electron beams and x-rays are known in the art. These resist compositions, however, rely on the single-layer resist method although the bi-layer resist method is advantageous in forming a pattern with a high aspect ratio on a stepped substrate. These resist compositions are not yet practically acceptable because of the outstanding problems of substrate steps, light reflection from substrates, and difficulty of forming high-aspect ratio patterns.

As is known in the art, the bi-layer resist method is advantageous in forming a high-aspect ratio pattern on a stepped substrate. It is also known that in order to develop a bi-layer resist film with a common alkaline developer, high molecular weight silicone compounds having hydrophilic groups such as hydroxyl and carboxyl groups must be used.

Among silicone base chemically amplified positive resist compositions, recently proposed were those compositions comprising a base resin in the form of polyhydroxybenzylsilsesquioxane, which is a stable alkali-soluble silicone polymer, in which some phenolic hydroxyl groups are blocked with tBOC groups, in combination with a photoacid generator (see JP-A 7-118651 and SPIE vol. 1925 (1993), 377). Also JP-A 9-110938 discloses a silicone-containing polymer using a silicon-containing acrylic monomer.

The silicon-containing polymer of the acrylic pendant type has the drawback that its resistance to dry etching with oxygen plasma is weak as compared with The silsesquioxane polymer. A low silicon content accounts for this weak dry etching resistance. The silicon-containing polymer of the siloxane pendant type has the drawback that it is repellent to developer and less wettable therewith. Then SPIE vol. 3678, pp. 214, 241 and 562 describes a polymer containing a monomer of the trisilane or tetrasilane pendant type having an increased silicon content and a silicon-containing substituent which can be eliminated with acid. However, since silane compounds of at least disilane exhibit strong absorption at the wavelength of ArF excimer laser, an increased introduction of such silanes undesirably leads to a lower transmittance. Besides, an attempt of introducing silicon into acid labile groups is reported in SPIE vol. 3678, p. 420. Because of a low acid elimination ability, there are drawbacks including low environmental stability and a T-top profile.

SUMMARY OF THE INVENTION

An object of the invention is to provide a novel polymer which is useful as the base polymer in a chemically amplified positive resist composition having a high sensitivity and high resolution, especially suitable as a material for use in the bi-layer resist method adapted to form a high-aspect ratio pattern, and capable of forming a pattern having improved heat resistance. Another object of the invention is to provide a chemically amplified positive resist composition comprising the polymer as the base resin, and a method for forming a pattern using the same.

We have found that by incorporating silicon-containing substituent groups of the general formula (1) to be shown below, the silicon content of a polymer can be increased to an effective level to prevent the transmittance of ArF excimer laser light from lowering. The silicon-containing substituent group of formula (1) functions as an acid-eliminatable substituent group by substituting for the lo hydroxyl group on a carboxylic acid, alcohol or phenol, and especially the hydroxyl group of a phenol or carboxyl group as shown by the general formula (2) to (5) to be shown below. This substituent group has so high an acid eliminating ability that the environmental stability following exposure is improved and a T-top profile is thus precluded.

In a first aspect, the invention provides a polymer having silicon-containing groups of the general formula (1):

(1)

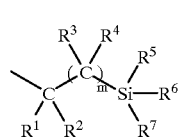

Herein $R^1$ to $R^4$ each are independently hydrogen or a straight, branched or cyclic alkyl group of 1 to 20 carbon atoms, or $R^1$ and $R^2$, taken together, may form an aliphatic hydrocarbon ring in which —$CH_2$— may be substituted with a —$Si(R^8)_2$— group, and $R^3$ and $R^4$, taken together, may form an aliphatic hydrocarbon ring in which —$CH_2$— may be substituted with a —$Si(R^8)_2$— group. $R^5$ to $R^7$ each are independently a straight, branched or cyclic alkyl or fluorinated alkyl group of 1 to 20 carbon atoms or aryl group of 6 to 20 carbon atoms. $R^8$ is independently a straight or branched alkyl group of 1 to 4 carbon atoms, and m is 1 or 2.

Preferably, hydrogen atoms of hydroxyl groups on a carboxylic acid, alcohol or phenol are substituted with the silicon-containing groups of the general formula (1).

A preferred embodiment of the invention provides a polymer comprising recurring units of one of the general formulae (2) to (5).

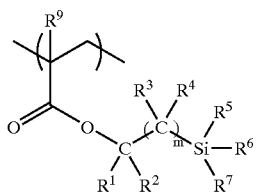
(2)

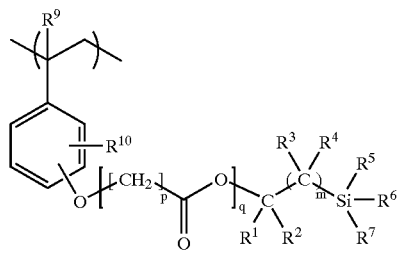
(3)

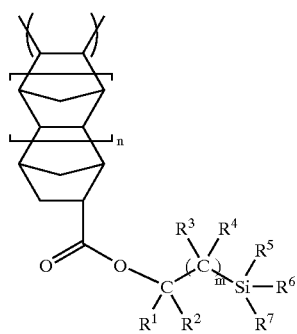
(4)

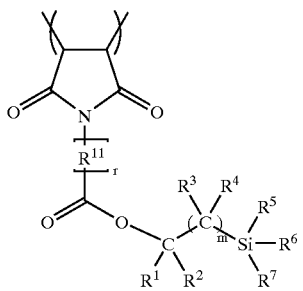
(5)

Herein $R^1$ to $R^7$ and m are as defined above. $R^9$ is hydrogen, a straight, branched or cyclic alkyl group of 1 to 20 carbon atoms, or $CH_2CO_2R^{12}$. $R^{10}$ is hydrogen or a straight, branched or cyclic alkyl group of 1 to 20 carbon atoms. $R^{11}$ is a straight, branched or cyclic alkylene group of 1 to 10 carbon atoms. $R^{12}$ is hydrogen or a straight, branched or cyclic alkyl group of 1 to 20 carbon atoms, n is a number of 0 to 5, p is a number of 1 to 5, each of q and r is 0 or 1.

In a second aspect, the invention provides a chemically amplified positive resist composition comprising (A) the polymer defined above, (B) a photoacid generator, and (C) an organic solvent. Also contemplated herein is a chemically amplified positive resist composition comprising (A) the polymer defined above, (B) a photoacid generator, (C) an organic solvent, and (D) a dissolution rate inhibitor having an acid labile group. The resist composition may further include (E) a basic compound.

In a third aspect, the invention provides a process for forming a pattern, comprising the steps of applying the positive resist composition onto an organic film on a substrate to form a coating; prebaking the coating to form a resist film; exposing the resist film in a pattern circuit region to radiation; post-exposure baking the resist film; developing the resist film with an aqueous alkaline solution to dissolve away the exposed area, thereby forming a resist pattern; and processing the organic film with an oxygen plasma generated by a dry etching apparatus.

DESCRIPTION OF THE PREFERRED EMBODIMENT

Polymer

The polymer or high molecular weight compound of the invention contains silicon-containing groups of the following general formula (1).

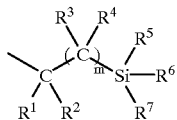
(1)

Specifically, the inventive polymer has silicon-containing acid labile groups which exert the β-cation stabilizing effect of silicon substitution. These groups advantageously have an improved acid elimination ability and prevent the development of a T-top profile. Since silicon atoms are separated by carbon atoms, the formation of a disilane bond is precluded, eliminating the risk of lowering the transmittance to ArF laser light.

In formula (1), $R^1$ to $R^4$, which may be the same or different, are independently selected from hydrogen and straight, branched or cyclic alkyl groups of 1 to 20 carbon atoms, preferably 1 to 10 carbon atoms, and more preferably 1 to 6 carbon atoms. Examples of suitable straight, branched or cyclic alkyl groups include methyl, ethyl, propyl, isopropyl, n-butyl, isobutyl, tert-butyl, pentyl, cyclopentyl, hexyl, octyl, decyl, and dodecyl. Alternatively, a pair of $R^1$ and $R^2$ or a pair of $R^3$ and $R^4$, taken together with the carbon atom to which they are bonded, may form an aliphatic hydrocarbon ring having 4 to 20 carbon atoms, preferably 6 to 15 carbon atoms, and more preferably 6 to 10 carbon atoms. In this case, each of $R^1$ and $R^2$ or each of $R^3$ and $R^4$ may be a straight, branched or cyclic alkylene group represented by —$(CH_2)x$— wherein x is selected so as to form an aliphatic hydrocarbon ring having a carbon number in the above range. Some or all of the —$CH_2$— groups may be substituted with —$Si(R^8)_2$— groups wherein $R^8$ is independently a straight or branched alkyl group of 1 to 4 carbon atoms.

$R^5$ to $R^7$, which may be the same or different, are independently selected from straight, branched or cyclic alkyl or fluorinated alkyl groups of 1 to 20 carbon atoms, preferably 1 to 10 carbon atoms, and more preferably 1 to 6 carbon atoms, and aryl groups of 6 to 20 carbon atoms, preferably 6 to 16 carbon atoms, and more preferably 6 to 12 carbon atoms. Exemplary alkyl groups are as enumerated above. Suitable fluorinated alkyl groups include the foregoing alkyl groups in which some or all of the hydrogen atoms are replaced by fluorine atoms, for example, difluoromethyl, 2,2-difluoroethyl, 2,2,2-trifluoroethyl, 3,3,3-trifluoropropyl, 2,2,3,3-tetrafluoropropyl and 2,2,3,3,3-pentafluoropropyl. Examples of suitable aryl groups include phenyl, tolyl, xylyl and naphthyl. The letter m is 1 or 2.

Preferably, the silicon-containing groups of the general formula (1) are included as having substituted for hydrogen atoms of hydroxyl groups on a carboxylic acid, alcohol or phenol. In this regard, the polymer of the invention is preferably defined as comprising recurring units of any one of the general formulae (2) to (5):

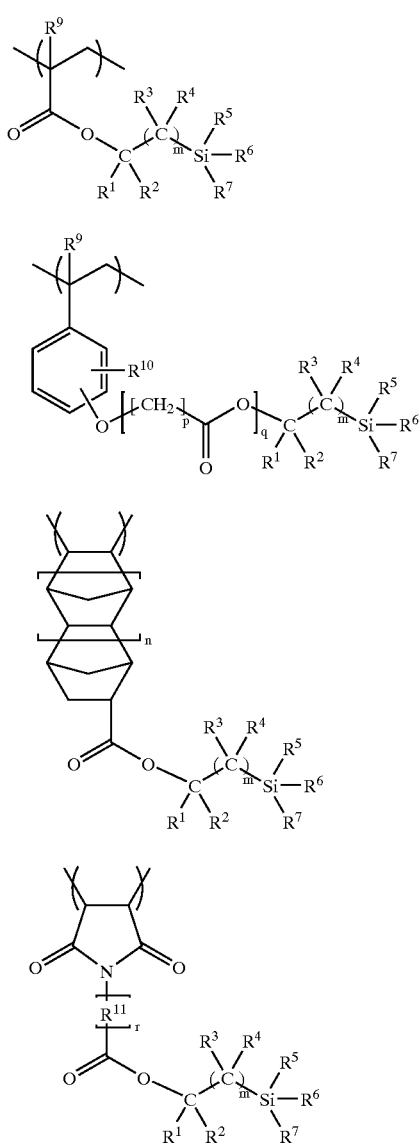

Herein $R^1$ to $R^7$ are as defined above; $R^9$ is hydrogen, a straight, branched or cyclic $C_{1-20}$ alkyl group, or $CH_2CO_2R^{12}$; $R^{10}$ is hydrogen or a straight, branched or cyclic $C_{1-20}$ alkyl group; $R^{11}$ is a straight, branched or cyclic $C_{1-10}$ alkylene group; $R^{12}$ is hydrogen or a straight, branched or cyclic $C_{1-20}$ alkyl group; m is 1 or 2, n is a number of 0 to 5, p is a number of 1 to 5, each of q and r is 0 or 1.

Examples of the $C_{1-20}$ alkyl group are as enumerated above, with those groups having 1 to 15 carbon atoms, especially 1 to 6 carbon atoms being preferred. Examples of $C_{1-10}$ alkylene groups include methylene, ethylene, propylene, butylene, pentylene, cyclopentylene, hexylene, cyclohexylene and octylene, with those groups having 1 to 6 carbon atoms, especially 1 to 3 carbon atoms being preferred.

Illustrative examples of the recurring units having silicon-containing acid labile groups of formulae (2) through (5) are given below. It is noted that Me is methyl and Et is ethyl.

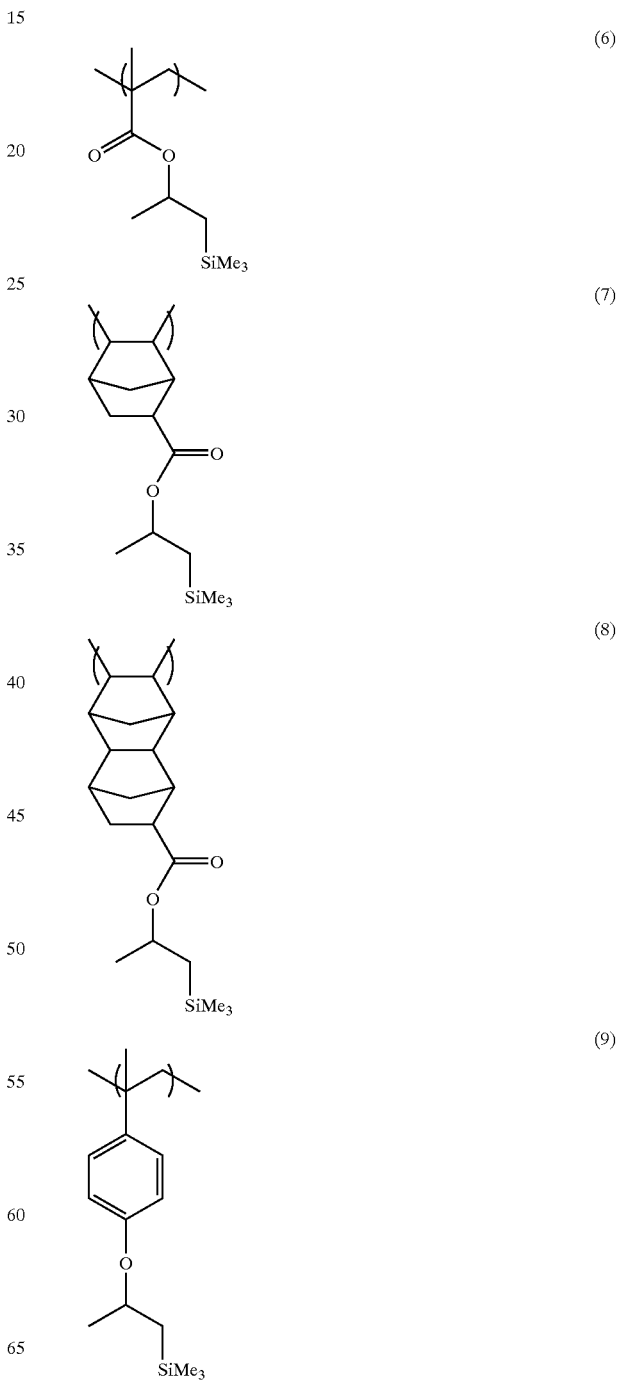

(10) 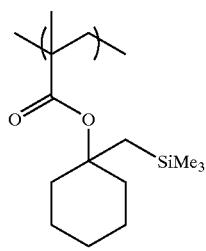
(11) 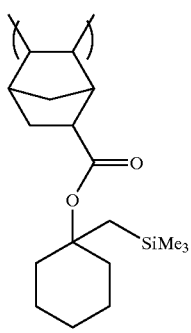
(12) 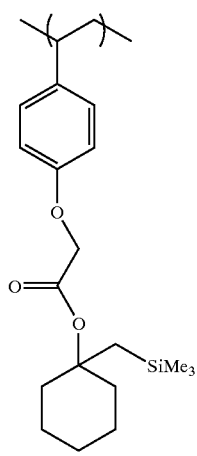
(13) 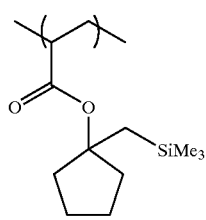
(14) 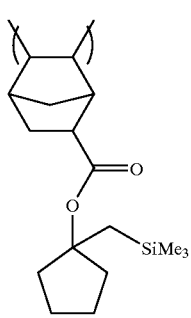
(15) 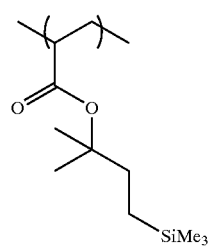
(16) 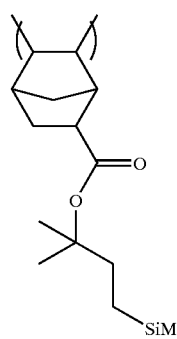
(17) 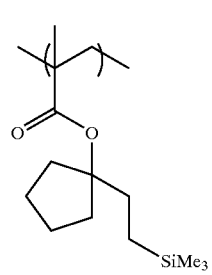
(18) 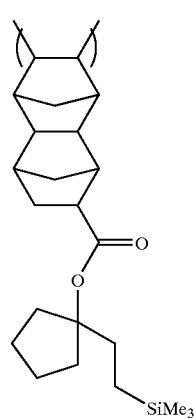
(19) 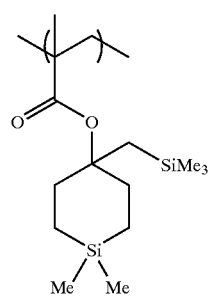

(20) 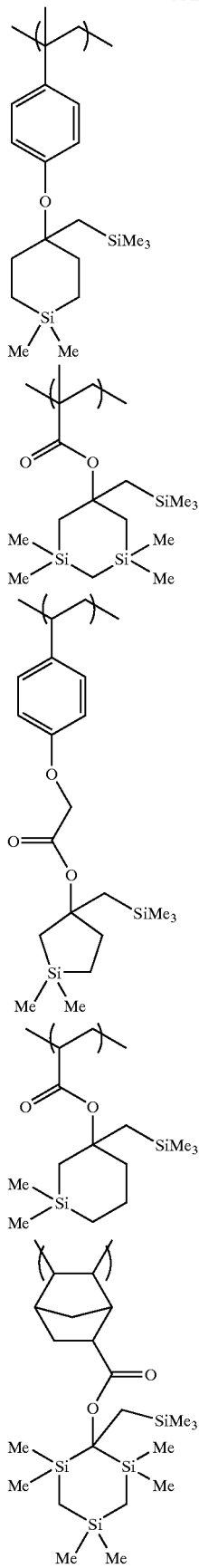

(21) 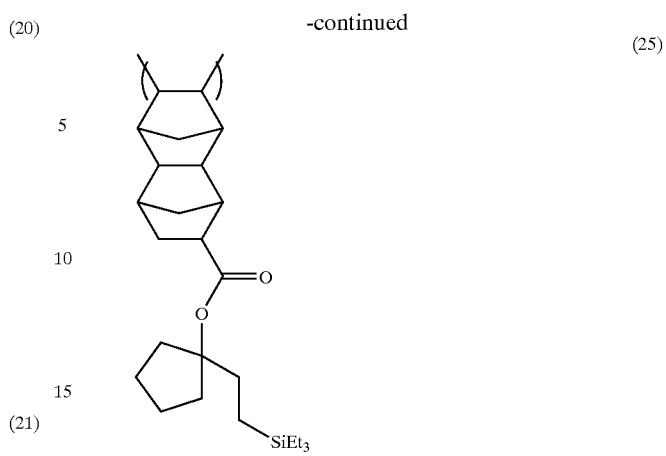

(22)

(23)

(24)

(25)

The silicon-containing polymer of the invention, which includes recurring units having silicon-containing substituent groups of acid-eliminatable nature, may further include additional recurring units having acid-eliminatable substituent groups for the purpose of enhancing the contrast. Like the silicon-containing acid-eliminatable substituent groups, these groups are preferably incorporated as having substituted for hydrogen atoms of hydroxyl groups on a carboxylic acid, alcohol or phenol. Thus the additional recurring units are preferably any one of the following units.

(2A) 

(3A) 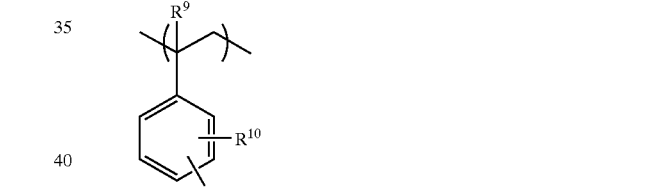

(4A) 

(5A) 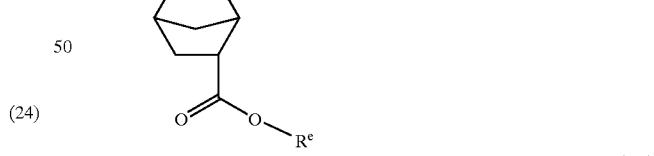

Herein $R^e$ is an acid-eliminatable substituent group, $R^9$, $R^{10}$, $R^{11}$, n and r are as defined above.

The acid-eliminatable substituent groups, also referred to as acid labile groups, may be selected from a variety of such groups, and preferably from among groups of the following formulae (26) and (27), tertiary $C_{4-40}$ alkyl groups of the following formula (28), and oxoalkyl groups of 4 to 20 carbon atoms.

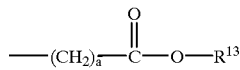
(26)

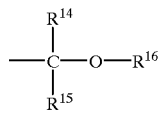
(27)

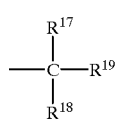
(28)

In formula (26), $R^{13}$ is a tertiary alkyl group of 4 to 20 carbon atoms, preferably 4 to 15 carbon atoms, an oxoalkyl group of 4 to 20 carbon atoms, or a group of formula (28). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary oxoalkyl groups are 3-oxocyclohexyl, 4-methyl-2-oxooxan-4-yl, and 5-methyl-5-oxooxolan-4-yl. Letter "a" is an integer of 0 to 6.

In formula (27), $R^{14}$ and $R^{15}$ are hydrogen or straight, branched or cyclic alkyl groups of 1 to 18 carbon atoms, preferably 1 to 10 carbon atoms. Exemplary alkyl groups include methyl, ethyl, n-propyl, isopropyl, n-butyl, sec-butyl, tert-butyl, cyclopentyl, cyclohexyl, 2-ethylhexyl, and n-octyl. $R^{16}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and straight, branched or cyclic alkyl groups in which some hydrogen atoms are replaced by hydroxyl, alkoxy, oxo, amino, alkylamino or the like. Illustrative examples are the substituted alkyl groups shown below.

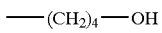
(29)

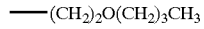
(30)

(31)

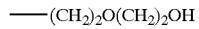
(32)

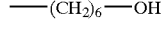
(33)

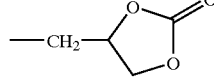
(34)

A pair of $R^{14}$ and $R^{15}$, $R^{14}$ and $R^{16}$, or $R^{15}$ and $R^{16}$ may form a ring. Each of $R^{14}$, $R^{15}$ and $R^{16}$ is a straight or branched alkylene group of 1 to 18 carbon atoms, preferably 1 to 10 carbon atoms when they form a ring.

Examples of the acid labile groups of formula (26) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Of the acid labile groups of formula (27), the straight and branched ones are exemplified by the following groups.

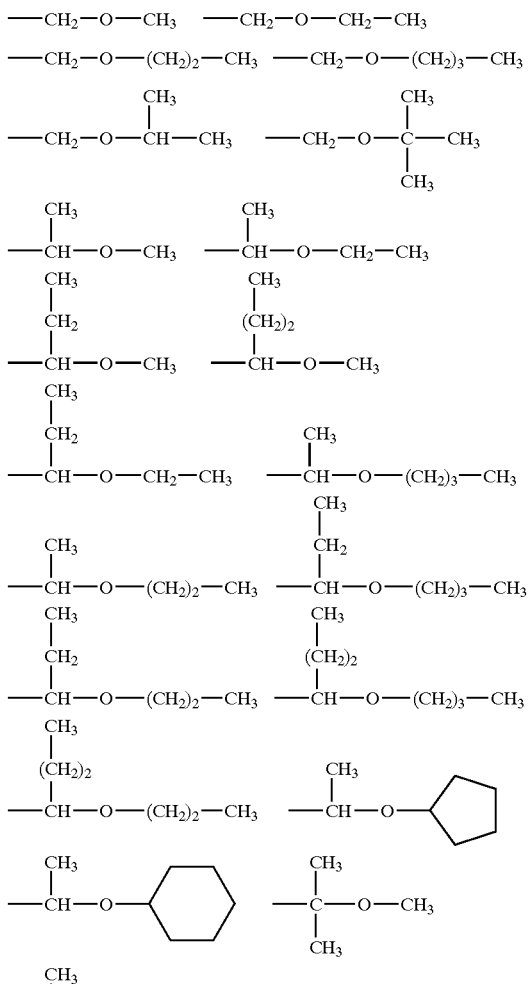

Of the acid labile groups of formula (27), the cyclic ones are, for example, tetrahydrofuran-2-yl, 2-methyltetrahydrofuran-2-yl, tetrahydropyran-2-yl, and 2-methyltetrahydropyran-2-yl. Preferred among the groups of formula (27) are ethoxyethyl, butoxyethyl and ethoxypropyl.

In formula (28), $R^{17}$, $R^{18}$ and $R^{19}$ are independently monovalent hydrocarbon groups, for example, straight, branched or cyclic alkyl groups of 1 to 20 carbon atoms, which may contain a hetero atom such as oxygen, sulfur, nitrogen or fluorine. A pair of $R^{17}$ and $R^{18}$, a pair of $R^{17}$ and $R^{19}$, or a pair of $R^{18}$ and $R^{19}$, taken together, may form a ring.

Examples of the tertiary alkyl group represented by formula (28) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other illustrative examples of the tertiary alkyl group are given below as formulae (35) through (50).

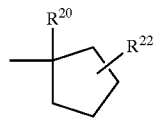 (35)

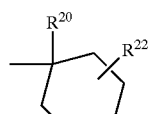 (36)

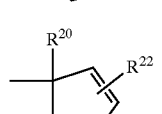 (37)

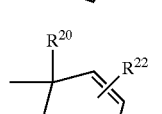 (38)

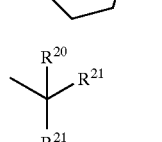 (39)

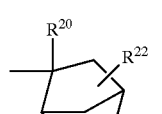 (40)

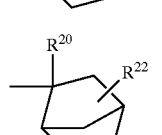 (41)

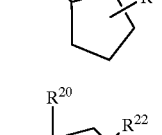 (42)

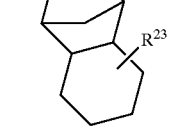 (43)

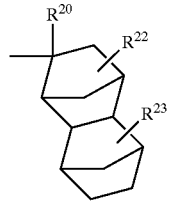 (44)

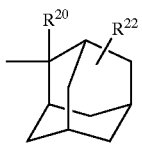 (45)

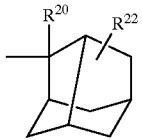 (46)

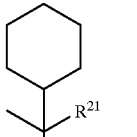 (47)

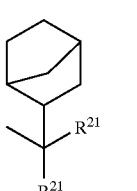 (48)

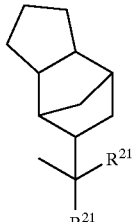 (49)

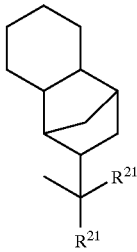 (50)

Herein, $R^{20}$ and $R^{21}$ each are a straight, branched or cyclic alkyl group of 1 to 6 carbon atoms, for example, methyl, ethyl, propyl, isopropyl, n-butyl, sec-butyl, n-pentyl, n-hexyl, cyclopropyl, cyclopropylmethyl, cyclobutyl, cyclopentyl or cyclohexyl. $R^{22}$ is hydrogen, a monovalent $C_{1-6}$ hydrocarbon group which may contain a hetero atom or a monovalent $C_{1-6}$ hydrocarbon group which may be separated by a hetero atom, with the hydrocarbon being typically alkyl. The hetero atom is an oxygen, sulfur or nitrogen atom, which is contained or intervenes in the form of —OH, —OR, —O—, —S—, —S(=O)—, —NH$_2$, —NHR, —NR$_2$, —NH—, or —NR— wherein R is an alkyl group of 1 to 20 carbon atoms, and especially 1 to 16 carbon atoms.

R$^{23}$ is hydrogen or an alkyl, hydroxyalkyl, alkoxy or alkoxyalkyl group of 1 to 20 carbon atoms, especially 1 to 16 carbon atoms, which may be straight, branched or cyclic. Illustrative examples include methyl, hydroxymethyl, ethyl, hydroxyethyl, propyl, isopropyl, n-butyl, sec-butyl, n-pentyl, n-hexyl, methoxy, methoxymethoxy, ethoxy, and tert-butoxy.

The oxoalkyl groups of 4 to 20 carbon atoms include 3-oxocyclohexyl and groups of the following formulae.

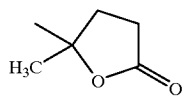
(51)

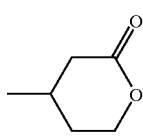
(52)

For improving adhesion, the polymer may additionally include recurring units of at least one type containing a hydrophilic substituent group such as anhydride, ester (lactone), carbonate, alcohol, amide or ketone, which units are enumerated below.

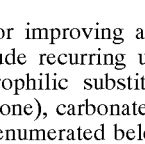
(53)

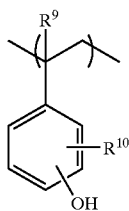
(54)

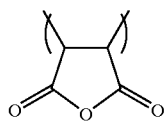
(55)

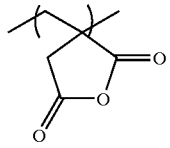
(56)

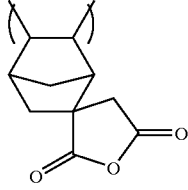
(57)

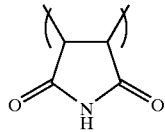
(58)

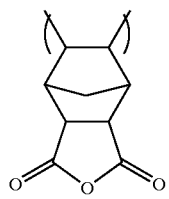
(59)

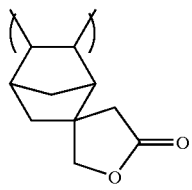
(60)

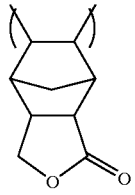
(61)

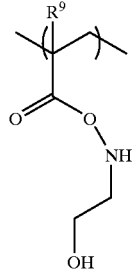
(62)

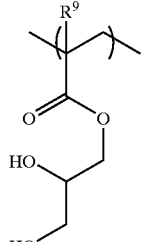
(63)

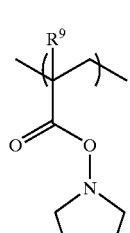
(64)

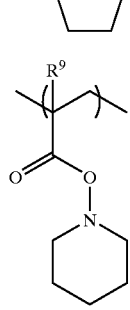

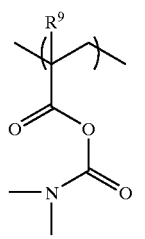 (65)
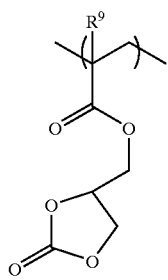 (66)
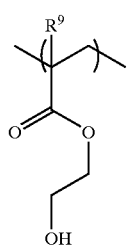 (67)
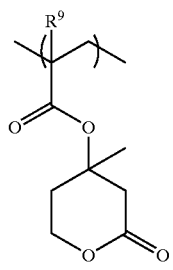 (68)
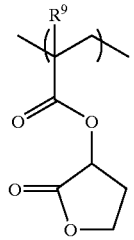 (69)
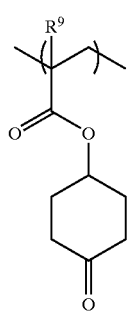 (70)
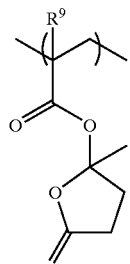 (71)
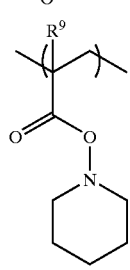 (72)
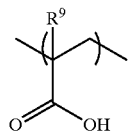 (73)
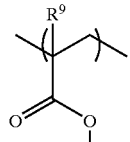 (74)
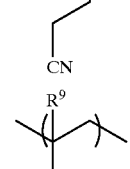 (75)
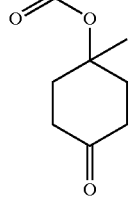 (76)
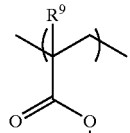 (77)

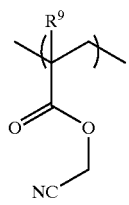 (78)
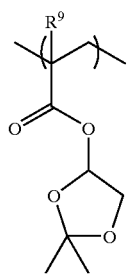 (79)
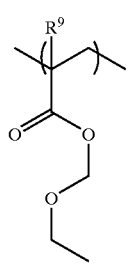 (80)
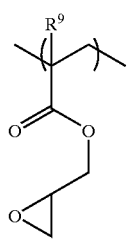 (81)
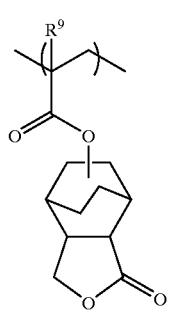 (82)
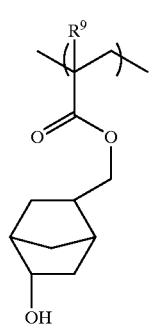 (83)
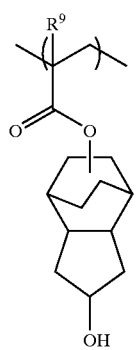 (84)
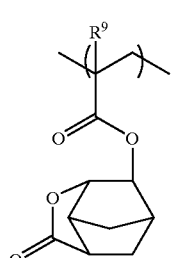 (85)
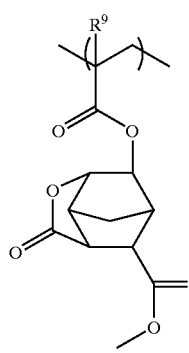 (86)
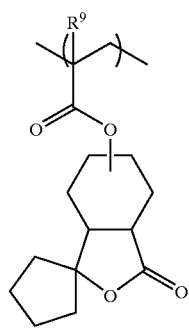 (87)
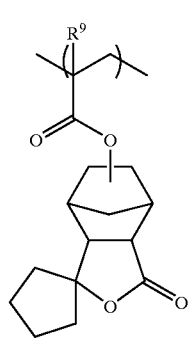 (88)

-continued (89)

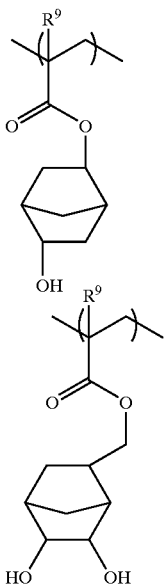

(90)

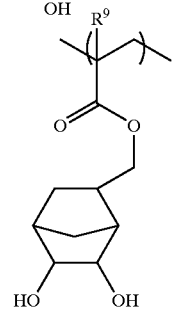

Herein $R^9$ and $R^{10}$ are as defined above.

In the polymer, further recurring units can be incorporated for the purpose of increasing the silicon content of the polymer to enhance its resistance to oxygen plasma etching. Examples of further recurring units are given below.

(Si-1)

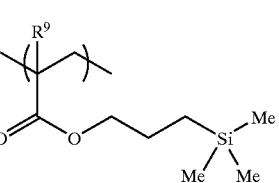

(Si-2)

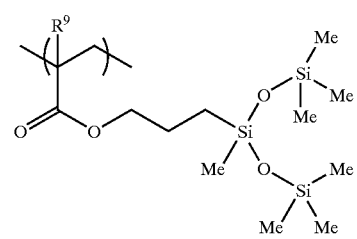

(Si-3)

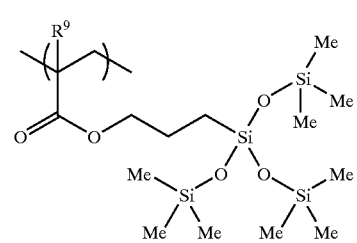

(Si-4)

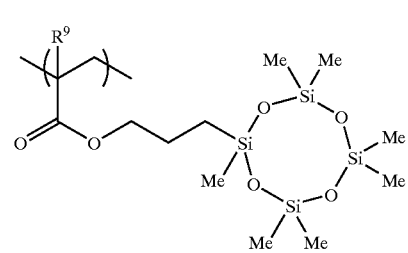

(Si-5)

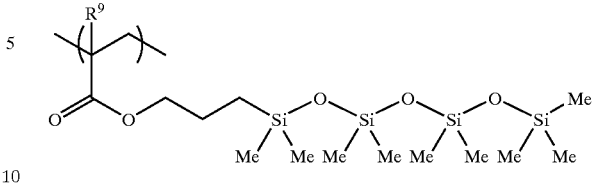

Herein $R^9$ is as defined above and Me is methyl.

The polymer is prepared in a conventional manner by furnishing predetermined amounts of a monomer having a silicon-containing group of formula (1), preferably a monomer or monomers capable of forming units of the formulae (2) through (5) and optionally, a monomer or monomers capable of forming units of formulae (2A) to (5A), a monomer or monomers capable of forming units of formulae (53) to (90) and a monomer or monomers capable of forming units of formulae (Si-1) to (Si-5), mixing the monomers in a solvent, adding a catalyst, and effecting polymerization reaction while heating or cooling if necessary. The polymerization reaction depends on the type of initiator (or catalyst), trigger means (light, heat, radiation or plasma), and polymerization conditions (including temperature, pressure, concentration, solvent and additive). Commonly used for the preparation of the inventive polymer are a radical copolymerization mode utilizing a radical of 2,2'-azobis-isobutyronitrile (AIBN) etc. for initiating polymerization and an ionic polymerization (anionic polymerization) mode using alkyl lithium catalysts. In either mode, polymerization can be done in a conventional manner. It is understood that the monomers capable of forming units of formulae (2) to (5) can be synthesized by the procedure described in Synthesis Example 1 or analogous procedures.

The polymer of the invention can be represented by the following formula.

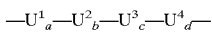

Herein $U^1$ stands for recurring units having a silicon-containing group of formula (1), preferably recurring units of formulae (2) to (5), and especially recurring units of formulae (6) to (25); $U^2$ stands for recurring units of formulae (2A) to (5A); $U^3$ stands for recurring units of formulae (53) to (90); and $U^4$ stands for recurring units of formulae (Si-1) to (Si-5). The letters "a" to "d" are numbers satisfying $0<a\leq1$, $0\leq b<1$, $0\leq c<1$, $0\leq d<1$, and $a+b+c+d=1$. Preferably "a" is from more than 0 to 0.9, more preferably from 0.2 to 0.8, "b" is from 0 to 0.5, more preferably from 0 to 0.3, "c" is from 0 to 0.8, more preferably from 0.1 to 0.6, and "d" is from 0 to 0.5, more preferably from 0 to 0.3.

The polymer preferably has a weight average molecular weight of about 1,000 to about 500,000, and especially about 3,000 to about 100,000.

Resist Composition

The polymer of the invention is suitable as a base resin in a resist composition. Thus the invention provides a resist composition comprising the above-described polymer. More specifically, the resist composition is defined herein as comprising (A) the above-described polymer as a base resin, (B) a photoacid generator, (C) an organic solvent, and optionally (D) a dissolution rate inhibitor having an acid labile group, (E) a basic compound and other components.

Organic Solvent (C)

The organic solvent used herein may be any organic solvent in which the base resin (the inventive polymer), photoacid generator, dissolution rate inhibitor and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, it is recommended to use diethylene glycol dimethyl ether, 1-ethoxy-2-propanol and ethyl lactate because the photoacid generator is most soluble therein, propylene glycol monomethyl ether acetate because it is a safe solvent, or a mixture thereof.

Photoacid Generator (B)

Suitable examples of the photoacid generator (B) include onium salts of formula (91) below, diazomethane derivatives of formula (92) below, glyoxime derivatives of formula (93) below, β-ketosulfone derivatives, disulfone derivatives, nitrobenzylsulfonate derivatives, sulfonic acid ester derivatives, and imidoyl sulfonate derivatives.

$$(R^{24})_b M^+ K^- \quad (91)$$

In the formula, $R^{24}$ is a straight, branched or cyclic alkyl of 1 to 12 carbon atoms, an aryl of 6 to 12 carbon atoms, or an aralkyl of 7 to 12 carbon atoms; $M^+$ is iodonium or sulfonium; $K^-$ is a non-nucleophilic counter-ion; and the letter b is 2 or 3.

Illustrative examples of alkyl groups represented by $R^{24}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

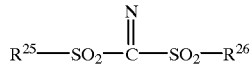

(92)

In the formula, $R^{25}$ and $R^{26}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{25}$ and $R^{26}$ include methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorobenzene, chlorobenzene, and 1,2,3,4,5-pentafluorobenzene. Exemplary aralkyl groups include benzyl and phenethyl.

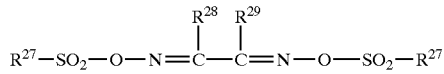

(93)

In the formula, $R^{27}$, $R^{28}$, and $R^{29}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{28}$ and $R^{29}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{27}$, $R^{28}$, and $R^{29}$ are exemplified by the same groups mentioned above for $R^{25}$ and $R^{26}$. Examples of alkylene groups represented by $R^{28}$ and $R^{29}$ include methylene, ethylene, propylene, butylene, and hexylene.

Illustrative examples of the photoacid generator include:

onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)

diazomethane, bis(isoamylsulfonyl)diazomethane, bis(secamylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; and glyoxime derivatives such as bis-O-(p-toluenesulfonyl)-α-dimethylglyoxime and bis-O-(n-butanesulfonyl)-α-dimethylglyoxime. These photoacid generators may be used singly or in combinations of two or more thereof. Onium salts are effective for improving rectangularity, while diazomethane derivatives and gly-oxime derivatives are effective for reducing standing waves. The combination of an onium salt with a diazomethane or a glyoxime derivative allows for fine adjustment of the profile.

The photoacid generator is added in an amount of 0.2 to 15 parts by weight, and especially 0.5 to 8 parts by weight, per 100 parts by weight of all the base resins. At less than 0.2 part, the amount of acid generated during exposure would be too low and the sensitivity and resolution are poor, whereas the addition of more than 15 parts would lower the transmittance of the resist and results in a poor resolution.

Dissolution Rate Inhibitor (D)

To the resist composition, a dissolution rate inhibitor may be added. The dissolution rate inhibitor is a compound having on the molecule at least two phenolic hydroxyl groups, in which an average of from 0 to 100 mol % of all the hydrogen atoms on the phenolic hydroxyl groups are replaced with acid labile groups or a compound having on the molecule at least one carboxyl group, in which an average of 10 to 100 mol % of all the hydrogen atoms on the carboxyl groups are replaced with silicon-containing groups of formula (1), both the compounds having an average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

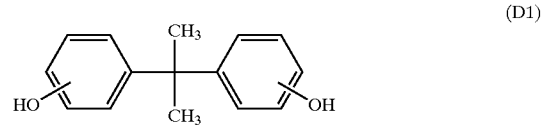

(D1)

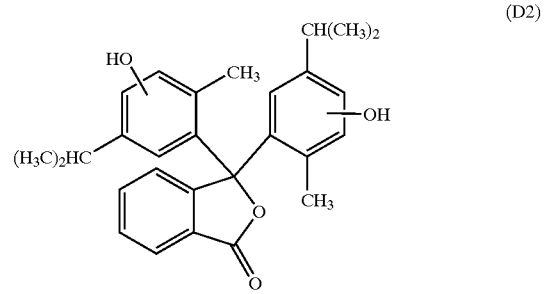

(D2)

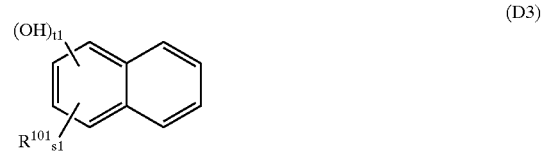

(D3)

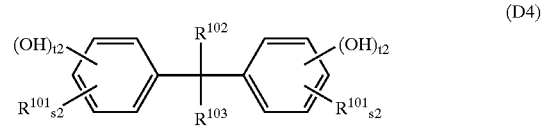

(D4)

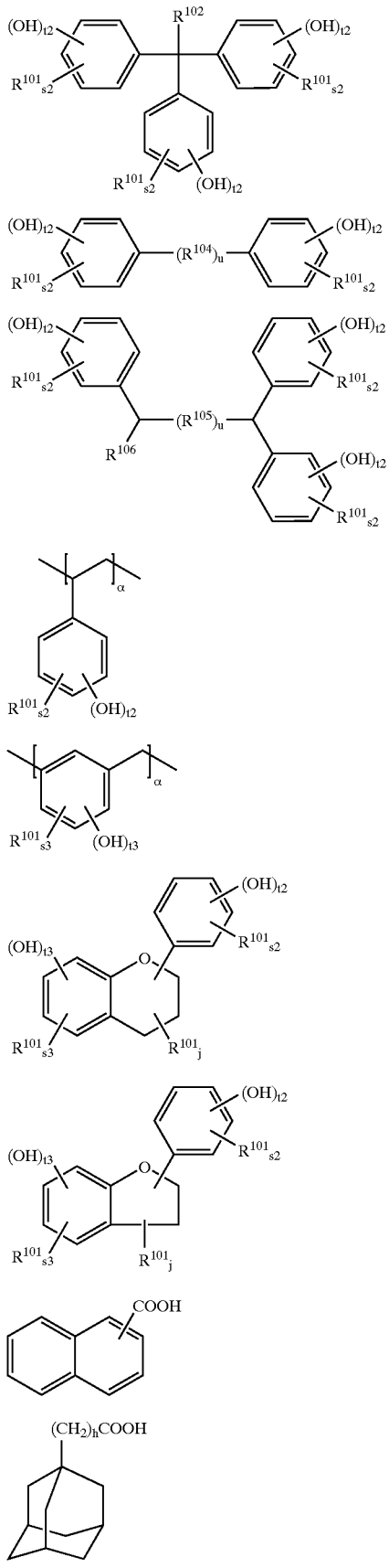

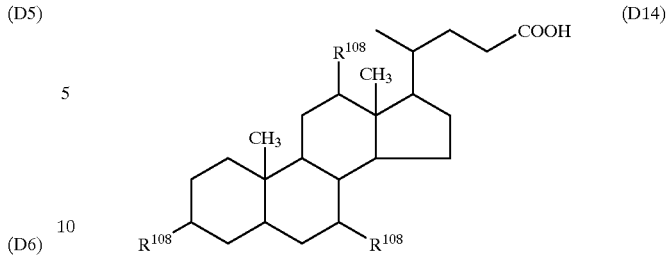

In these formulas, $R^{101}$ and $R^{102}$ are each hydrogen or a straight or branched alkyl or alkenyl of 1 to 8 carbon atoms; $R^{103}$ is hydrogen, a straight or branched alkyl or alkenyl of 1 to 8 carbon atoms, or $-(R^{107})_h-COOH$; $R^{104}$ is $-(CH_2)_i-$ (where i=2 to 10), an arylene of 6 to 10 carbon atoms, carbonyl, sulfonyl, an oxygen atom, or a sulfur atom; $R^{105}$ is an alkylene of 1 to 10 carbon atoms, an arylene of 6 to 10 carbon atoms, carbonyl, sulfonyl, an oxygen atom, or a sulfur atom; $R^{106}$ is hydrogen, a straight or branched alkyl or alkenyl of 1 to 8 carbon atoms, or a hydroxyl-substituted phenyl or naphthyl; $R^{107}$ is a straight or branched alkylene of 1 to 10 carbon atoms; $R^{108}$ is hydrogen or hydroxyl; the letter j is an integer from 0 to 5; u and h are each 0 or 1; s1, t1, s2, t2, s3, and t3 are each numbers which satisfy s1+t1=8, s2+t2=5, and s3+t3=4, and are such that each phenyl skeleton has at least one hydroxyl group; and α is a number such that the compounds of formula (D8) or (D9) have a molecular weight of from 100 to 1,000.

In the above formulas, suitable examples of $R^{101}$ and $R^{102}$ include hydrogen, methyl, ethyl, butyl, propyl, ethynyl, and cyclohexyl; suitable examples of $R^{103}$ include the same groups as for $R^{101}$ and $R^{102}$, as well as —COOH and —CH₂COOH; suitable examples of $R^{104}$ include ethylene, phenylene, carbonyl, sulfonyl, oxygen, and sulfur; suitable examples of $R^{105}$ include methylene as well as the same groups as for $R^{104}$; and suitable examples of $R^{106}$ include hydrogen, methyl, ethyl, butyl, propyl, ethynyl, cyclohexyl, and hydroxyl-substituted phenyl or naphthyl.

Basic Compound (E)

The basic compound (E) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. (See, for example, JP-A 5-232706, JP-A 5-249683, JP-A 5-158239, JP-A 5-249662, JP-A 5-257282, JP-A 5-289322, and JP-A 5-289340).

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives. Of these, aliphatic amines are especially preferred.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formulas (94) and (95) may also be included.

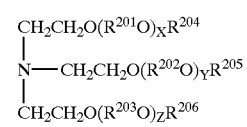

(94)

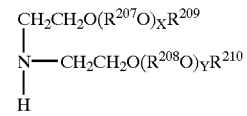

(95)

In the formulas, $R^{201}$, $R^{202}$, $R^{203}$, $R^{207}$ and $R^{208}$ independently straight, branched or cyclic alkylenes of 1 to 20 carbon atoms; $R^{204}$, $R^{205}$, $R^{206}$, $R^{209}$ and $R^{210}$ are hydrogen, alkyls of 1 to 20 carbon atoms, or amino; $R^{204}$ and $R^{205}$, $R^{205}$ and $R^{206}$, $R^{204}$ and $R^{206}$, $R^{204}$ with $R^{205}$ and $R^{206}$, and $R^{209}$ and $R^{210}$ may bond together to form rings; and X, Y and Z are each integers from 0 to 20, with the proviso that hydrogen is excluded from $R^{204}$, $R^{205}$, $R^{206}$, $R^{209}$ and $R^{210}$ when X, Y and Z are equal to 0.

The alkylene groups represented by $R^{201}$, $R^{202}$, $R^{203}$, $R^{207}$ and $R^{208}$ preferably have 1 to 20 carbon atoms, more preferably 1 to 10 carbon atoms, and most preferably 1 to 8 carbon atoms. Examples include methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{204}$, $R^{205}$, $R^{206}$, $R^{209}$ and $R^{210}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

Where $R^{204}$ and $R^{205}$, $R^{205}$ and $R^{206}$, $R^{204}$ and $R^{206}$, $R^{204}$ with $R^{205}$ and $R^{206}$, and $R^{209}$ and $R^{210}$ form rings, the rings preferably have 1 to 20 carbon atoms, more preferably 1 to 8 carbon atoms, and most preferably 1 to 6 carbon atoms, and may have branching alkyl groups of 1 to 6 carbon atoms, and especially 1 to 4 carbon atoms.

X, Y, and Z are each integers from 0 to 20, preferably from 1 to 10, and more preferably from 1 to 8.

Illustrative examples of the compounds of formulas (94) and (95) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5, and 1-aza-18-crown-6. Especially preferred basic compounds are tertiary amines, aniline derivatives, pyrrolidine derivatives, pyridine derivatives, quinoline derivatives, amino acid derivatives, hydroxyl group-bearing nitrogenous compounds, hydroxyphenyl group-bearing nitrogenous compounds, alcoholic nitrogenous compounds, amide derivatives, imide derivatives, tris{2-(methoxymethoxy)ethyl}amine, tris{2-(2-methoxyethoxy)ethyl}amine, tris[2-{(2-methoxyethoxy)methyl}ethyl]amine, and 1-aza-15-crown-5.

The above-described basic compound may be used singly or in combinations of two or more thereof, and is preferably formulated in an amount of 0.01 to 2 parts by weight, and especially 0.01 to 1 part by weight, per 100 parts by weight of all the base resins. At less than 0.01 part, the desired effects of the basic compound would not be apparent, while the use of more than 2 parts would result in too low a sensitivity.

The resist composition of the invention may include optional ingredients, typically a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, and fluorinated organosiloxane compounds. Useful surfactants are commercially available under the trade names Florade FC-430 and FC-431 from Sumitomo 3M Co., Ltd., Surflon S-141, S-145, S-381 and S-383 from Asahi Glass Co., Ltd., Unidyne DS-401, DS-403 and DS-451 from Daikin Industry Co., Ltd., Megaface F-8151, F-171, F-172, F-173 and F-177 from Dai-Nippon Ink & Chemicals, Inc., and X-70-092 and X-70-093 from Shin-Etsu Chemical Co., Ltd. Preferred surfactants are Florade FC-430 from Sumitomo 3M K.K. and X-70-093 from Shin-Etsu Chemical Co., Ltd.

Pattern formation using the resist composition of the invention may be carried out by a known lithographic technique. For example, the resist composition is applied onto an organic film on a substrate such as a novolac film of about 0.1 to 10.0 μm thick on a silicon wafer by spin coating or the like to form a resist film having a thickness of 0.1 to 1.0 μm, which is then pre-baked on a hot plate at 60 to 200° C. for 10 seconds to 10 minutes, and preferably at 80 to 150° C. for 30 seconds to 5 minutes. A patterning mask having the desired pattern is then placed over the resist film, and the film is exposed through the mask to an electron beam or high-energy radiation having a wavelength of up to 300 nm such as deep-UV, an excimer laser, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for 30 seconds to 3 minutes. Development is then carried out using as the developer an aqueous alkali solution, such as a 0.1 to 5% (preferably 2 to 3%) aqueous solution of tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the resist composition of the invention is best suited to micropattern formation with, in particular, deep-UV rays and excimer laser light having a wavelength of 254 to 120 nm, especially KrF excimer laer of 248 nm or ArF excimer laser of 193 nm, x-rays, and an electron beam. The desired pattern may not be obtainable outside the upper and lower limits of the above range.

In the developing step, the exposed area of the resist film is dissolved away until the underlying organic film is exposed. Then the exposed area of the organic film is conventionally processed with an oxygen plasma generated by a dry etching apparatus.

The resist composition comprising the polymer of the invention as a base resin is sensitive to high-energy radiation and has excellent sensitivity and resolution at a wavelength of less than 300 nm, and high resistance to oxygen plasma etching. Because of these advantages, the resist composition is suited for bi-layer resist and easily forms a finely defined pattern having sidewalls perpendicular to the substrate. The resist composition lends itself to micropatterning for the fabrication of VLSIs.

EXAMPLE

Synthesis Examples and Examples are given below together with Comparative Examples for further illustrating the invention although the invention is not limited thereby. The abbreviations used have the following meaning, THF for tetrahydrofuran, Me for methyl, Et for ethyl, NMR for nuclear magnetic resonance, Mw for weight average molecular weight, and Mn for number average molecular weight.

Silicon-containing monomers were synthesized according to the following procedures.

Synthesis Example 1-1

Synthesis of Monomer 1

A flask was charged with 36.5 g of magnesium and 350 ml of THF, to which a solution of 184 g of chloromethyltrimethylsilane diluted with 250 ml of THF was added dropwise at 50° C. The addition was followed by one hour of stirring at 65° C., after which 66.1 g of acetaldehyde was added dropwise below 20° C. After one hour of stirring at room temperature, an aqueous solution of ammonium chloride was added for hydrolysis. Ordinary post-treatments yielded 158.7 g (yield 70%) of 1-trimethylsilyl-2-propanol.

In 500 ml of methylene chloride was dissolved 119.8 g of 1-trimethylsilyl-2-propanol. To the solution under ice cooling, 91.6 g of triethylamine was added dropwise, and 113.5 g of methacryloyl chloride then added dropwise. The solution was stirred for 5 hours at room temperature. Water was added to the reaction mixture, followed by ordinary post-treatments. Upon vacuum distillation, there was obtained 135.9 g (yield 75%) of 1-trimethylsilyl-2-propyl methacrylate (Monomer 1).

Boiling point: 75–77° C./1.33×10³ Pa $^1$H-NMR (270 MHz, CDCl$_3$) σ: 0.03 (s, 9H), 0.87–1.14 (m, 2H), 1.28 (d, 3H), 1.92 (s, 3H), 5.04–5.16 (m, 1H), 5.51 (m, 1H), 6.05 (m, 1H)

IR: 2956, 2898, 1716, 1637, 1317, 1295, 1251, 1168, 1132, 1124, 863, 838 cm$^{-1}$

Synthesis Example 1-2

Synthesis of Monomer 2

As in Synthesis Example 1-1, 1-trimethylsilyl-2-propyl 5-norbornene-2-carboxylate (Monomer 2) was synthesized.

Synthesis Example 1-3

Synthesis of Monomer 3

As in Synthesis Example 1-1, 1-trimethylsilyl-2-propyl 8-tetracyclo[4.4.0.1$^{2,5}$.1$^{7,10}$]dodecene-3-carboxylate (Monomer 3) was synthesized.

Synthesis Example 1-4

Synthesis of Monomer 4

As in Synthesis Example 1-1, p-(1-trimethylsilyl-2-propoxy)styrene (Monomer 4) was synthesized.

Synthesis Example 1-5

Synthesis of Monomer 5

A flask was charged with 27.9 g of magnesium and 250 ml of THF, to which a solution of 135 g of chloromethyltrimethylsilane diluted with 150 ml of THF was added dropwise at 50° C. The addition was followed by one hour of stirring at 65° C., after which 98.1 g of cyclohexanone was added dropwise below 20° C. After one hour of stirring at room temperature, an aqueous solution of ammonium chloride was added for hydrolysis. This was followed by ordinary post-treatments. Upon vacuum distillation, there was obtained 141.6 g (yield 76%) of 1-trimethylsilylmethylcyclohexanol.

Boiling point: 60–62° C./66.6 Pa $^1$H-NMR (270 MHz, CDCl$_3$) σ: 0.06 (s, 9H), 0.95 (s, 2H), 1.24 (s, 2H), 1.43–1.59 (m, 10H)

IR: 3471, 2933, 2859, 1448, 1247, 968, 948, 863, 838 cm$^{-1}$

In 50 ml of methylene chloride was dissolved 10.0 g of 1-trimethylsilylmethylcyclohexanol. To the solution under ice cooling, 7.8 g of methacryloyl chloride was added dropwise, and 9.8 g of triethylamine then added dropwise. The solution was stirred for 20 hours at room temperature. Water was added to the reaction mixture, followed by ordinary post-treatments. Upon vacuum distillation, there was obtained 10.8 g (yield 79%) of 1-trimethylsilylmethylcyclohexyl methacrylate (Monomer 5).

Boiling point: 78–81° C./53.3 Pa $^1$H-NMR (270 MHz, CDCl$_3$) σ: 0.16 (s, 9H), 1.12–1.65 (m, 10H), 1.91 (t, 3H), 2.25–2.32 (m, 2H), 5.48 (m, 1H), 6.03 (m, 1H)

IR: 2933, 2859, 1712, 1637, 1326, 1309, 1249, 1178, 1159, 1126, 858, 840 cm$^{-1}$

Synthesis Example 1-6

Synthesis of Monomer 6

As in Synthesis Example 1-5, 1-trimethylsilylmethylcyclohexyl 5-norbornene-2-carboxylate (Monomer 6) was synthesized.

Synthesis Example 1-7

Synthesis of Monomer 7

As in Synthesis Example 1-5, 1-trimethylsilylmethylcyclohexyl p-vinylphenoxyacetate (Monomer 7) was synthesized.

Synthesis Example 1-8

Synthesis of Monomer 8

A flask was charged with 14.6 g of magnesium and 120 ml of THF, to which a solution of 67.5 g of chloromethyltrimethylsilane diluted with 70 ml of THF was added dropwise at 50° C. The addition was followed by one hour of stirring at 65° C., after which 42.1 g of cyclopentanone was added dropwise below 20° C. After one hour of stirring at room temperature, an aqueous solution of ammonium chloride was added for hydrolysis. This was followed by ordinary post-treatments. Upon vacuum distillation, there was obtained 70.6 g (yield 82%) of 1-trimethylsilylmethylcyclopentanol.

In 160 ml of methylene chloride was dissolved 34.5 g of 1-trimethylsilylmethylcyclopentanol. To the solution under ice cooling, 29.3 g of methacryloyl chloride was added dropwise, and 30.4 g of triethylamine then added dropwise. The solution was stirred for 20 hours at room temperature. Water was added to the reaction mixture, followed by ordinary post-treatments. Upon vacuum distillation, there was obtained 39.9 g (yield 83%) of 1-trimethylsilylmethylcyclopentyl methacrylate (Monomer 8).

Synthesis Example 1-9

Synthesis of Monomer 9

As in Synthesis Example 1-8, 1-trimethylsilylmethylcyclopentyl 5-norbornene-2-carboxylate (Monomer 9) was synthesized.

Synthesis Example 1-10

Synthesis of Monomer 10

A flask was charged with 300 ml of a THF solution of 1M methylmagnesium chloride, to which 17.4 g of ethyl 3-trimethylsilylpropanoate was added dropwise below 50° C. The solution was stirred for one hour at room temperature, after which an aqueous solution of ammonium chloride was added for hydrolysis. This was followed by ordinary post-treatments. Upon vacuum distillation, there was obtained 14.1 g (yield 88%) of 2-methyl-4-trimethylsilyl-2-butanol.

Boiling point: 85–88° C./3.33×10³ Pa $^1$H-NMR (270 MHz, CDCl$_3$) σ: 0.00 (s, 9H), 0.45–0.51 (m, 2H), 1.18 (s, 6H), 1.36–1.44 (m, 3H)

IR: 3378, 2954, 2921, 2900, 1376, 1247, 1186, 904, 885, 863, 835 cm$^{-1}$

In 50 ml of methylene chloride was dissolved 9.5 g of 2-methyl-4-trimethylsilyl-2-butanol. To the solution under ice cooling, 9.8 g of methacryloyl chloride was added dropwise, and 12.0 g of triethylamine then added dropwise. The solution was stirred for 20 hours at room temperature. Water was added to the reaction mixture, followed by ordinary post-treatments. Upon vacuum distillation, there was obtained 11.2 g (yield 83%) of 2-methyl-4-trimethylsilyl-2-butyl methacrylate (Monomer 10).

Boiling point: 71–73° C./3.33×10² Pa $^1$H-NMR (270 MHz, CDCl$_3$) σ: 0.00 (s, 9H), 0.44–0.51 (m, 2H), 1.45 (s, 6H), 1.68–1.75 (m, 2H), 1.89 (s, 3H), 5.45 (m, 1H), 5.98 (m, 1H)

IR: 2954, 2929, 1714, 1639, 1332, 1302, 1249, 1168, 1147, 1126, 862, 835 cm$^{-1}$

Synthesis Example 1-11

Synthesis of Monomer 11

As in Synthesis Example 1-10, 2-methyl-4-trimethylsilyl-2-butyl 5-norbornene-2-carboxylate (Monomer 11) was synthesized.

Synthesis Example 1-12

Synthesis of Monomer 12

A flask was charged with 9.82 g of magnesium and 150 ml of THF, to which a solution of 43.5 g of 1,4-dibromobutane diluted with 50 ml of THF was added dropwise at 50° C. The solution was stirred for one hour at 65° C., after which 23.5 g of ethyl 3-trimethylsilylpropionate was added dropwise below 50° C. The solution was stirred for one hour at room temperature, after which an aqueous solution of ammonium chloride was added for hydrolysis. This was followed by ordinary post-treatments. Upon vacuum distillation, there was obtained 23.6 g (yield 94%) of 1-(2-trimethylsilylethyl) cyclopentanol.

Boiling point: 71–72° C./53.3 Pa $^1$H-NMR (270 MHz, CDCl$_3$) σ: 0.00 (s, 9H), 0.50–0.57 (m, 2H), 1.29 (s, 1H), 1.48–1.67 (m, 8H), 1.72–1.87 (m, 2H)

IR: 3372, 2954, 1247, 1245, 991, 896, 862, 836 cm$^{-1}$

In 60 ml of methylene chloride was dissolved 12.0 g of 1-(2-trimethylsilylethyl)cyclopentanol. To the solution under ice cooling, 11.8 g of methacryloyl chloride was added dropwise, and 14.3 g of triethylamine then added dropwise. The solution was stirred for 20 hours at room temperature. Water was added to the reaction mixture, followed by ordinary post-treatments. Upon vacuum distillation, there was obtained 14.0 g (yield 85%) of 1-(2-trimethylsilylethyl)cyclopentyl methacrylate (Monomer 12).

Boiling point: 74–75° C./40.0 Pa $^1$H-NMR (270 MHz, CDCl$_3$) σ: 0.16 (s, 9H), 1.12–1.65 (m, 10H), 1.91 (t, 3H), 2.25–2.32 (m, 2H), 5.48 (m, 1H), 6.03 (m, 1H)

IR: 2933, 2859, 1712, 1637, 1326, 1309, 1249, 1178, 1159, 1126, 858, 840 cm$^{-1}$

Synthesis Example 1-13

Synthesis of Monomer 13

As in Synthesis Example 1-12, 1-(2-trimethylsilylethyl) cyclopentyl 8-tetracyclo[4.4.0.1$^{2,5}$.1$^{7,10}$]dodecene-3-carboxylate (Monomer 13) was synthesized.

The following monomers (Monomers 14 to 20) were synthesized by analogous reaction or well-known reaction procedures.

Synthesis Example 1-14

Synthesis of Monomer 14

1-trimethylsilylmethyl-4,4-dimethyl-4-silacyclohexyl methacrylate

Synthesis Example 1-15

Synthesis of Monomer 15 p-(1-trimethylsilylmethyl-4,4-dimethyl-4-silacyclohexyloxy)styrene

Synthesis Example 1-16

Synthesis of Monomer 16

1-trimethylsilylmethyl-3,3,5,5-tetramethyl-3,5-disilacyclohexyl methacrylate

Synthesis Example 1-17

Synthesis of Monomer 17

1-trimethylsilylmethyl-3,3-dimethyl-3-silacyclopentyl p-vinylphenoxyacetate

Synthesis Example 1-18

Synthesis of Monomer 18

1-trimethylsilylmethyl-3,3-dimethyl-3-silacyclohexyl acrylate

Synthesis Example 1-19

Synthesis of Monomer 19

1-trimethylsilylmethyl-2,2,4,4,6,6-hexamethyl-2,4,6-trisilacyclohexyl 5-norbornene-2-carboxylate Synthesis Example 1-20

Synthesis of Monomer 20

1-(2-triethylsilylethyl)cyclopentyl 8-tetracyclo-[4.4.0.1$^{2,}$ 5.1$^{7,10}$]dodecene-3-carboxylate

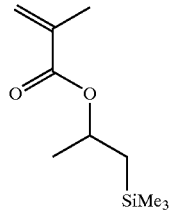

Monomer 1

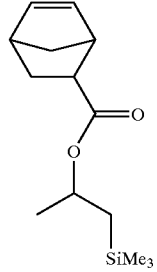

Monomer 2

-continued
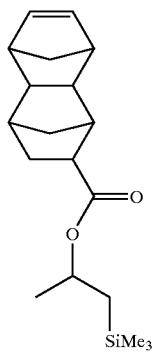
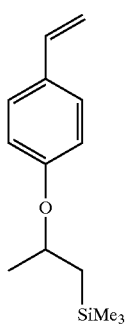
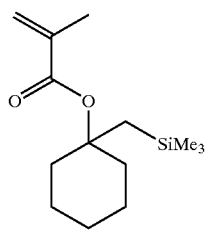
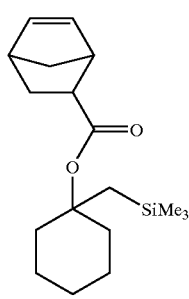
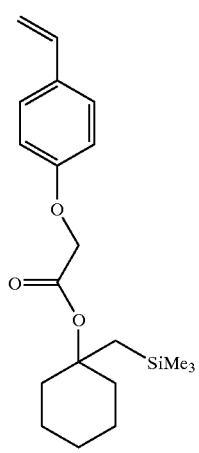
-continued
Monomer 3
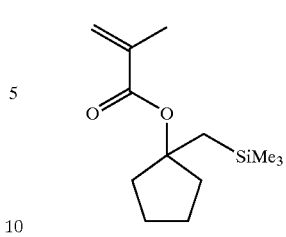
Monomer 4
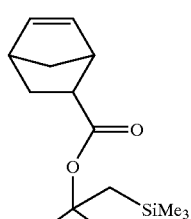
Monomer 5
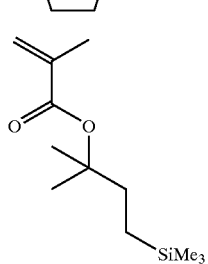
Monomer 6
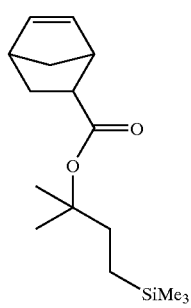
Monomer 7
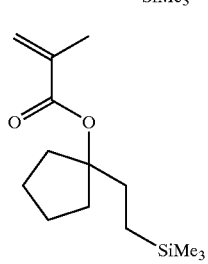
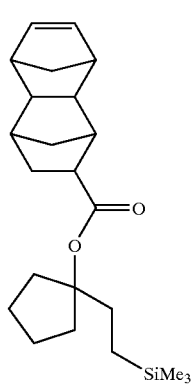
Monomer 8
Monomer 9
Monomer 10
Monomer 11
Monomer 12
Monomer 13

Monomer 14

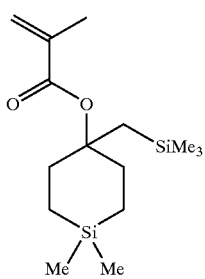

Monomer 15

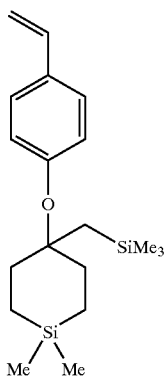

Monomer 16

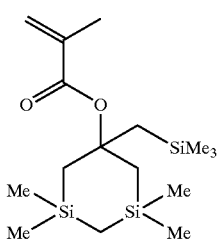

Monomer 17

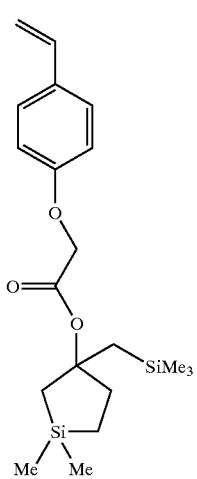

Monomer 18

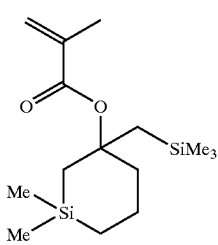

Monomer 19

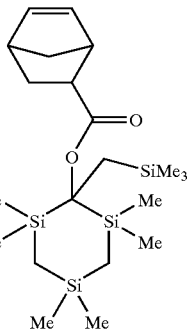

Monomer 20

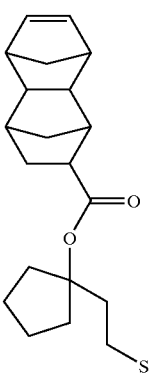

A silicon-containing polymer was synthesized according to the following procedure.

Synthesis Example 2-1

Synthesis of Polymer 1

In 100 ml of THF were dissolved 12.0 g of Monomer 1 and 6.8 g of 2-oxo-2,3,4,5-tetrahydrofuran-3-yl methacrylate. Then 1.6 g of 2,2'-azobisisobutyronitrile was added thereto. The solution was stirred for 15 hours at 60° C. and then added dropwise to 2 liters of n-hexane. The resulting solids were collected by filtration, washed with 1 liter of n-hexane, and vacuum dried at 40° C. for 6 hours, obtaining 11.8 g of a polymer shown below as Polymer 1. The yield was 63%. On GPC analysis using a polystyrene standard, it had a Mw of 10,000 and a polydispersity (Mw/Mn) of 1.80.

Polymers 2 to 23 were synthesized by similar or well-known procedures.

Polymer 1

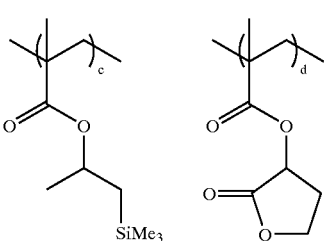

c = 0.6  d = 0.4
Mw = 10000  Mw/Mn = 1.80

-continued
Polymer 2
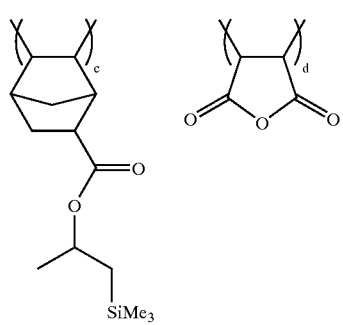
c = 0.5  d = 0.5
Mw = 6000  Mw/Mn = 1.75
Polymer 3
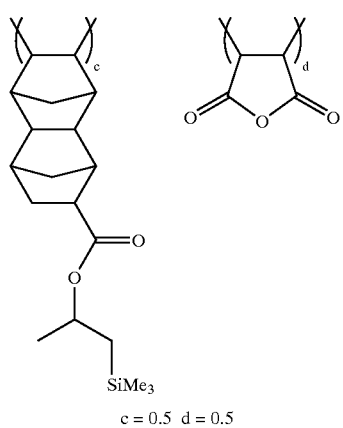
c = 0.5  d = 0.5
Mw = 5000  Mw/Mn = 1.65
Polymer 4
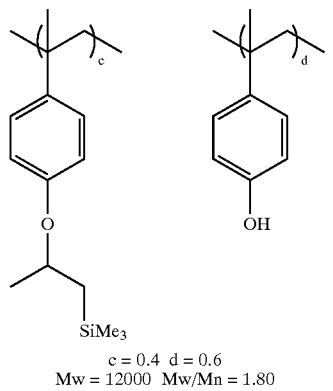
c = 0.4  d = 0.6
Mw = 12000  Mw/Mn = 1.80
Polymer 5
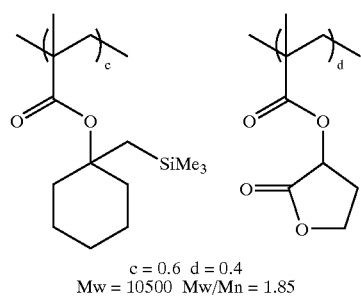
c = 0.6  d = 0.4
Mw = 10500  Mw/Mn = 1.85
Polymer 6
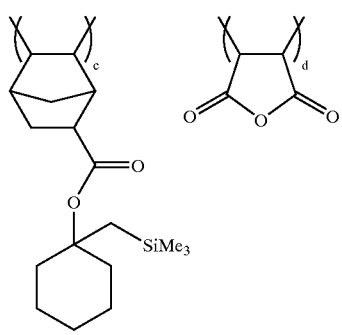
c = 0.5  d = 0.5
Mw = 6050  Mw/Mn = 1.80
Polymer 7
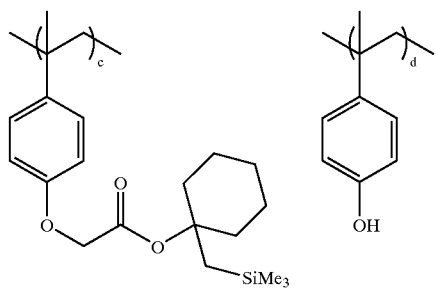
c = 0.3  d = 0.7
Mw = 10500  Mw/Mn = 1.80
Polymer 8
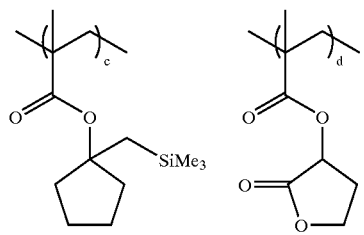
c = 0.6  d = 0.4
Mw = 10800  Mw/Mn = 1.65
Polymer 9
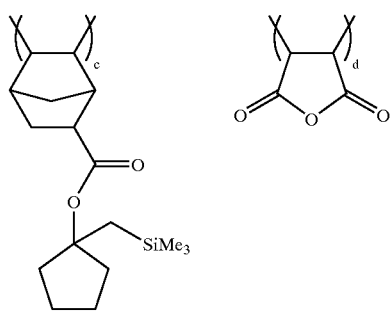
c = 0.5  d = 0.5
Mw = 8000  Mw/Mn = 1.85
Polymer 10
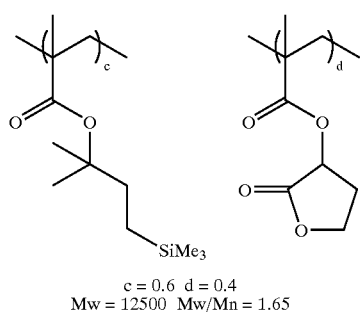
c = 0.6  d = 0.4
Mw = 12500  Mw/Mn = 1.65

Polymer 11
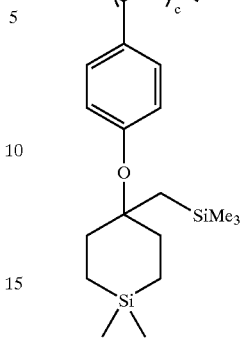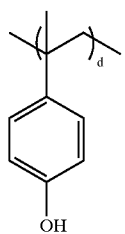
c = 0.5 d = 0.5
Mw = 8000 Mw/Mn = 1.83
Polymer 12
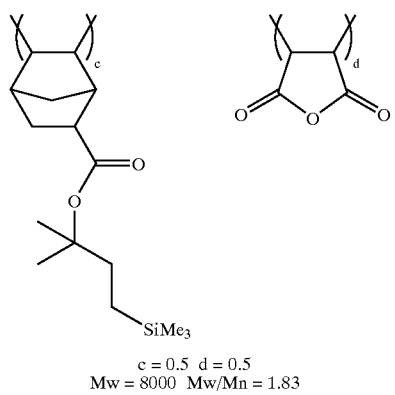
c = 0.6 d = 0.4
Mw = 10500 Mw/Mn = 1.80
Polymer 13
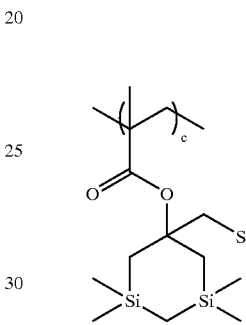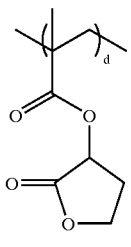
c = 0.5 d = 0.5
Mw = 5000 Mw/Mn = 1.82
Polymer 14
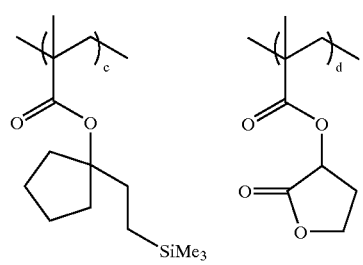
c = 0.6 d = 0.4
Mw = 11000 Mw/Mn = 1.75
Polymer 15
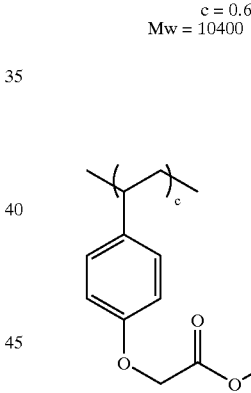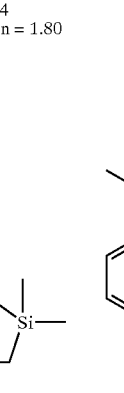
c = 0.3 d = 0.7
Mw = 12000 Mw/Mn = 1.81
Polymer 16
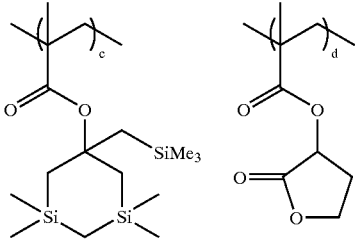
c = 0.6 d = 0.4
Mw = 10400 Mw/Mn = 1.80
Polymer 17
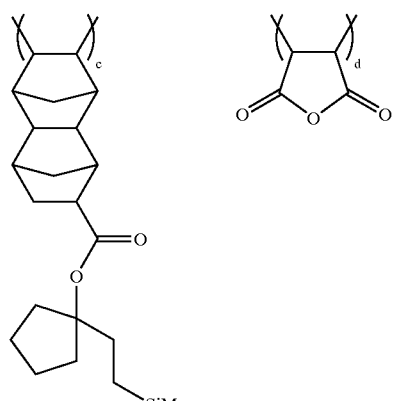
c = 0.3 d = 0.7
Mw = 11200 Mw/Mn = 1.86
Polymer 18
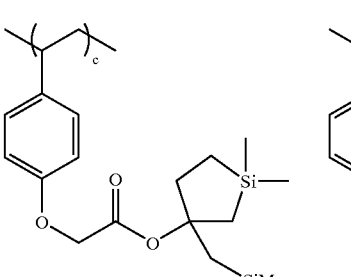
c = 0.6 d = 0.4
Mw = 11300 Mw/Mn = 1.68

Polymer 19

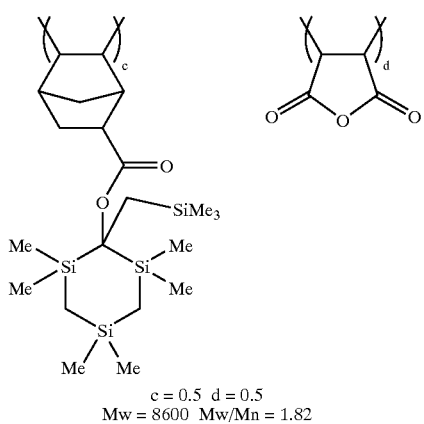

c = 0.5  d = 0.5
Mw = 8600  Mw/Mn = 1.82

Polymer 20

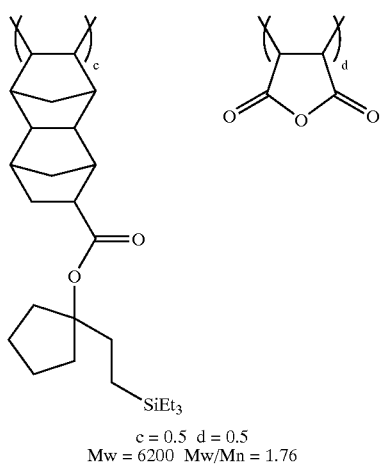

c = 0.5  d = 0.5
Mw = 6200  Mw/Mn = 1.76

Polymer 21

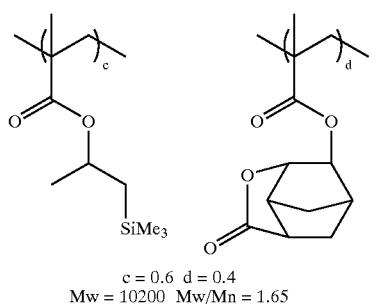

c = 0.6  d = 0.4
Mw = 10200  Mw/Mn = 1.65

Polymer 22

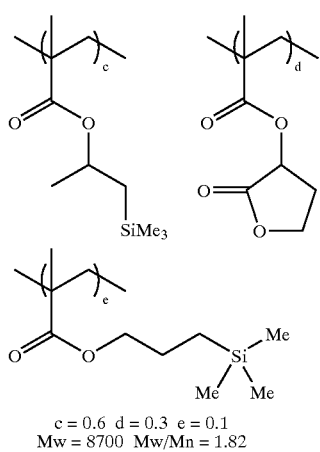

c = 0.6  d = 0.3  e = 0.1
Mw = 8700  Mw/Mn = 1.82

Polymer 23

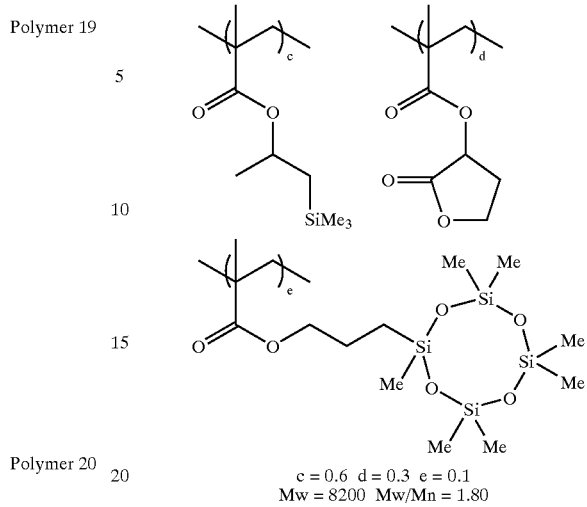

c = 0.6  d = 0.3  e = 0.1
Mw = 8200  Mw/Mn = 1.80

Resist compositions within the scope of the invention were examined for resolution upon KrF excimer laser exposure.

Examples 1-28

Resist Resolution

Resist solutions were prepared by dissolving Polymers 1 to 23 of the above formulae as the base resin, a photoacid generator (designated as PAG1 or 2), a basic compound (TBA, TEA or TMMEA), and a dissolution rate inhibitor (designated as DRI1 or 2) in PGMEA containing 0.01% by weight of surfactant Florade FC-430 (Sumitomo 3M), followed by filtration through a Teflon filter (pore diameter 0.10 μm).

PAG1

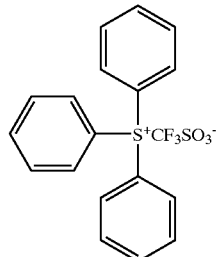

PAG2

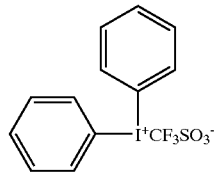

DRI1

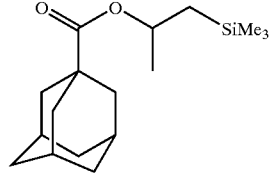

-continued

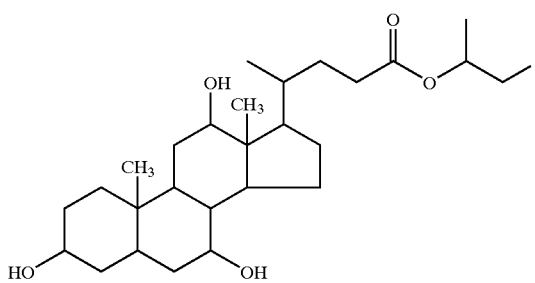
DRI2

TBA: tributylamine
TEA: triethanolamine
TMMEA: trismethoxymethoxyethylamine
PGMEA: propylene glycol monomethyl ether acetate On silicon wafers, lower resist films of 0.5 Mm thick were formed by applying novolac resist material OFPR-800 (Tokyo Ohka Kogyo Co., Ltd.) and heating at 300° C. for 5 minutes for curing. Antireflection films of 55 nm thick were formed thereon by spin coating DUV-30 (Brewer Science) and baking at 100° C. for 30 seconds and then at 200° C. for 60 seconds.

On the cured DUV-30/novolac resist/silicon wafer, the resist solutions were spin coated, then baked on a hot plate at 100° C. for 90 seconds to give resist films of 0.2 µm thick. Using a KrF excimer laser stepper (Nikon Corporation, NA 0.60), the resist films were exposed. The resist films were baked (PEB) at 110° C. for 90 seconds and then developed with a 2.38% aqueous solution of tetramethylammonium hydroxide, obtaining positive patterns.

The sensitivity of the resist was the exposure dose (mJ/cm$^2$) which provided a 1:1 line-to-space ratio in a 0.20 µm line-and-space pattern. The resolution of the resist was the minimum line width (µm) of the lines and spaces that separated at this dose.

Using a parallel plate sputter etching apparatus TE-8500 by Tokyo Electron Co., Ltd., the resist films were etched with an etchant, oxygen gas under the following conditions.

Oxygen gas flow rate: 0.05 l/min
Gas pressure: 1.3 Pa
RF power: 50 W
DC bias: 450 V The lower resist film was etched at a rate of 150 nm/min whereas the inventive resist film was etched at a rate of 15 nm/min. After 2 minutes of etching, those portions of the lower resist film which were not covered with the inventive resist film disappeared completely, leaving a bi-layer resist pattern having a thickness of 0.5 µm.

The evaluation results of the resists are shown in Table 1.

TABLE 1

| Example | Resin (pbw) | Photoacid generator (pbw) | Basic compound (pbw) | Dissolution rate inhibitor (pbw) | Solvent (pbw) | Sensitivity (mJ/cm$^2$) | Resolution (µm) |
|---|---|---|---|---|---|---|---|
| 1 | Polymer1 (80) | PAG1 (2) | TBA (0.1) | | PGMEA (1000) | 26 | 0.16 |
| 2 | Polymer2 (80) | PAG1 (2) | TBA (0.1) | | PGMEA (1000) | 20 | 0.17 |
| 3 | Polymer3 (80) | PAG1 (2) | TBA (0.1) | | PGMEA (1000) | 28 | 0.17 |
| 4 | Polymer4 (80) | PAG1 (2) | TBA (0.1) | | PGMEA (1000) | 20 | 0.17 |
| 5 | Polymer5 (80) | PAG1 (2) | TBA (0.1) | | PGMEA (1000) | 30 | 0.17 |
| 6 | Polymer6 (80) | PAG1 (2) | TBA (0.1) | | PGMEA (1000) | 27 | 0.16 |
| 7 | Polymer7 (80) | PAG1 (2) | TBA (0.1) | | PGMEA (1000) | 20 | 0.17 |
| 8 | Polymer8 (80) | PAG1 (2) | TBA (0.1) | | PGMEA (1000) | 28 | 0.17 |
| 9 | Polymer9 (80) | PAG1 (2) | TBA (0.1) | | PGMEA (1000) | 30 | 0.18 |
| 10 | Polymer10 (80) | PAG1 (2) | TBA (0.1) | | PGMEA (1000) | 32 | 0.18 |
| 11 | Polymer11 (80) | PAG1 (2) | TBA (0.1) | | PGMEA (1000) | 35 | 0.19 |
| 12 | Polymer12 (80) | PAG1 (2) | TBA (0.1) | | PGMEA (1000) | 28 | 0.17 |
| 13 | Polymer13 (80) | PAG1 (2) | TBA (0.1) | | PGMEA (1000) | 32 | 0.18 |
| 14 | Polymer14 (80) | PAG1 (2) | TBA (0.1) | | PGMEA (1000) | 26 | 0.16 |
| 15 | Polymer15 (80) | PAG1 (2) | TBA (0.1) | | PGMEA (1000) | 19 | 0.18 |
| 16 | Polymer16 (80) | PAG1 (2) | TBA (0.1) | | PGMEA (1000) | 24 | 0.16 |
| 17 | Polymer17 (80) | PAG1 (2) | TBA (0.1) | | PGMEA (1000) | 17 | 0.17 |

TABLE 1-continued

| Example | Resin (pbw) | Photoacid generator (pbw) | Basic compound (pbw) | Dissolution rate inhibitor (pbw) | Solvent (pbw) | Sensitivity (mJ/cm$^2$) | Resolution ($\mu$m) |
|---|---|---|---|---|---|---|---|
| 18 | Polymer18 (80) | PAG1 (2) | TBA (0.1) | | PGMEA (1000) | 26 | 0.16 |
| 19 | Polymer19 (80) | PAG1 (2) | TBA (0.1) | | PGMEA (1000) | 24 | 0.17 |
| 20 | Polymer20 (80) | PAG1 (2) | TBA (0.1) | | PGMEA (1000) | 29 | 0.18 |
| 21 | Polymer21 (80) | PAG1 (2) | TBA (0.1) | | PGMEA (1000) | 27 | 0.16 |
| 22 | Polymer22 (80) | PAG1 (2) | TBA (0.1) | | PGMEA (1000) | 25 | 0.16 |
| 23 | Polymer23 (80) | PAG1 (2) | TBA (0.1) | | PGMEA (1000) | 29 | 0.17 |
| 24 | Polymer24 (80) | PAG2 (2) | TBA (0.1) | | PGMEA (1000) | 17 | 0.16 |
| 25 | Polymer1 (70) | PAG1 (1) | TBA (0.1) | DRI1 (10) | PGMEA (1000) | 24 | 0.16 |
| 26 | Polymer1 (70) | PAG1 (1) | TBA (0.1) | DRI2 (10) | PGMEA (1000) | 23 | 0.16 |
| 27 | Polymer1 (80) | PAG1 (1) | TEA (0.1) | | PGMEA (1000) | 28 | 0.16 |
| 28 | Polymer1 (80) | PAG1 (1) | TMMEAA (0.2) | | PGMEA (1000) | 30 | 0.16 |

As is evident from Table 1, the resist compositions within the scope of the invention exhibit a high sensitivity and resolution upon KrF excimer laser exposure.

Japanese Patent Application No. 2000-293858 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

We claim:

1. A polymer having silicon-containing groups of formula (1):

wherein
one of $R^1$ and $R^2$ is a cyclic alkyl group of 1 to 20 carbon atoms and the other is hydrogen or a straight, branched or cyclic alkyl group of 1 to 20 carbon atoms, or $R^1$ and $R^2$, taken together, may form an aliphatic hydrocarbon ring in which —CH$_2$— may be substituted with a —Si($R^8$)$_2$— group, and $R^3$ and $R^4$ each are independently hydrogen or a straight, branched or cyclic alkyl group of 1 to 20 carbon atom, or $R^3$ and $R^4$, taken together, may form an aliphatic hydrocarbon ring in which —CH$_2$— may be substituted with a —Si($R^8$)$_2$— group,
$R^5$ to $R^7$ each are independently a straight, branched or cyclic alkyl or fluorinated alkyl group of 1 to 20 carbon atoms or aryl group of 6 to 20 carbon atoms,
$R^8$ is independently a straight or branched alkyl group of 1 to 4 carbon atoms, and m is 1 or 2.

2. A polymer of claim 1, wherein said polymer contains carboxylic acid, alcohol, or phenol groups or combinations thereof, and hydrogen atoms of hydroxyl groups on at least on one of said carboxylic acid, alcohol or phenol groups is substituted with the silicon-containing group of formula (1).

3. A chemically amplified positive resist composition comprising:

(A) the polymer of claim 1, (B) a photoacid generator, and (C) an organic solvent.

4. The resist composition of claim 3 further comprising a basic compound.

5. A process for forming a pattern, comprising:

applying a positive resist composition of claim 3 onto an organic film on a substrate to form a coating, prebaking the coating to form a resist film, exposing the resist film in a pattern circuit region to radiation, post-exposure baking the resist film, developing the resist film with an aqueous alkaline solution to dissolve away the exposed area, thereby forming a resist pattern, and processing the organic film with an oxygen plasma generated by a dry etching apparatus.

6. A chemically amplified positive resist composition comprising:

(A) the polymer of claim 1, (B) a photoacid generator, (C) an organic solvent, and (D) a dissolution rate inhibitor having an acid labile group.

7. The resist composition of claim 6 further comprising a basic compound.

8. A polymer comprising recurring units of one of the general formulae (2) to (5):

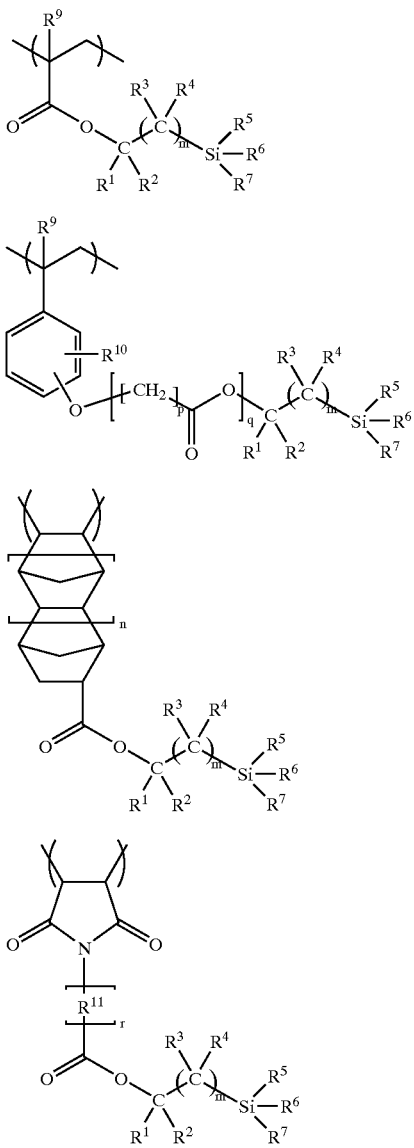

wherein
one of $R^1$ to $R^2$ is a cyclic alkyl group of 1 to 20 carbon atoms and the other is hydrogen or a straight, branched or cyclic alkyl group of 1 to 20 carbon atoms, or $R^1$ and $R^2$, taken together, may form an aliphatic hydrocarbon ring in which —$CH_2$— may be substituted with a —$Si(R^8)_2$— group, and $R^3$ and $R^4$ each are independently hydrogen or a straight, branched or cyclic alkyl group of 1 to 20 carbon atom, or $R^3$ and $R^4$, taken together, may form an aliphatic hydrocarbon ring in which —$CH_2$— may be substituted with a —$Si(R^8)_2$— group, $R^5$ to $R^7$ each are independently a straight, branched or cyclic alkyl or fluorinated alkyl group of 1 to 20 carbon atoms or aryl group of 6 to 20 carbon atoms, $R^8$ is independently a straight or branched alkyl group of 1 to 4 carbon atoms, $R^9$ is hydrogen, a straight, branched or cyclic alkyl group of 1 to 20 carbon atoms, or $CH_2CO_2R^{12}$, $R^{10}$ is hydrogen or a straight, branched or cyclic alkyl group of 1 to 20 carbon atoms, $R^{11}$ is a straight, branched or cyclic alkylene group of 1 to 10 carbon atoms, $R^{12}$ is hydrogen or a straight, branched or cyclic alkyl group of 1 to 20 carbon atoms, m is 1 or 2, n is a number of 0 to 5, p is a number of 1 to 5, each of q and r is 0 or 1.

9. A chemically amplified positive resist composition comprising:

(A) the polymer of claim 8, (B) a photoacid generator, and (C) an organic solvent.

10. A resist composition of claim 9, further comprising a basic compound.

11. A chemically amplified positive resist composition comprising:

(A) the polymer of claim 8, (B) a photoacid generator, (C) an organic solvent, and (D) a dissolution rate inhibitor having an acid labile group.

12. A resist composition of claim 11, further comprising a basic compound.

13. A polymer having silicon-containing groups of formula (1) and recurring units of at least one of formulae (56) to (90):

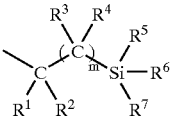

(1)

wherein one of $R^1$ and $R^2$ is a cyclic alkyl group having 1 to 20 carbon atoms and the other is hydrogen or a straight, branched or cyclic alkyl group of 1 to 20 carbon atoms, or $R^1$ and $R^2$, taken together, optionally form an aliphatic hydrocarbon ring in which —$CH_2$— is optionally substituted by —$Si(R^8)_2$— group, and $R^3$ and $R^4$ are each independently hydrogen or a straight, branched or cyclic alkyl group of 1 to 20 carbon atoms, or $R^3$ and $R^4$, taken together, optionally form an aliphatic hydrocarbon ring in which —$CH_2$— is optionally substituted by —$Si(R^8)_2$—, $R^5$ to $R^7$ each are independently a straight, branched or cyclic alkyl or fluorinated alkyl group of 1 to 20 carbon atoms or an aryl group of 6 to 20 carbon atoms, $R^8$ is independently a straight or branched alkyl group of 1 to 4 carbon atoms, and m is 1 or 2,

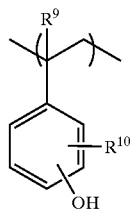

(53)

(54)
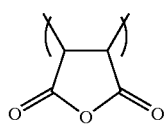
(55)
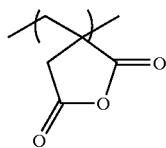
(56)
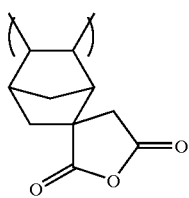
(57)
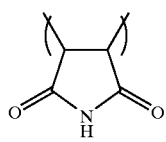
(58)
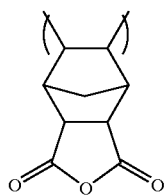
(59)
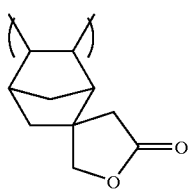
(60)
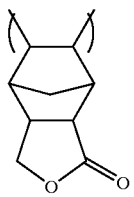
(61)
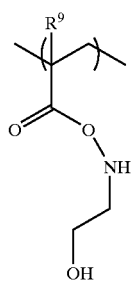
(62)
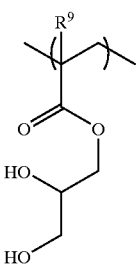
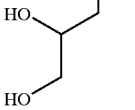
(63)
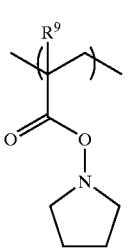
(64)
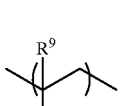
(65)
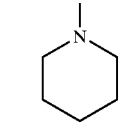
(66)
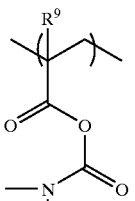
(67)
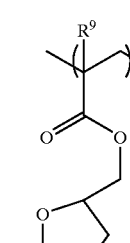

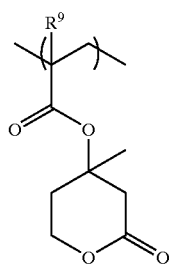 (68)
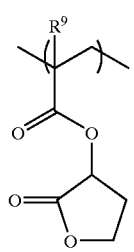 (69)
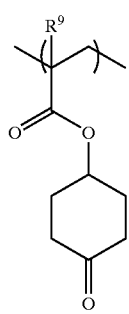 (70)
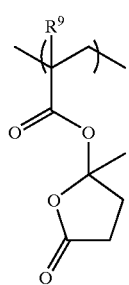 (71)
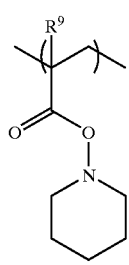 (72)
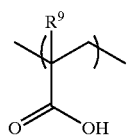 (73)
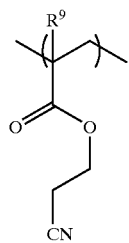 (74)
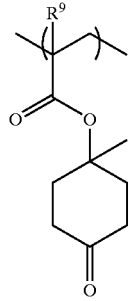 (75)
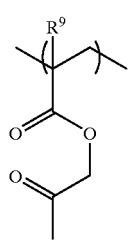 (76)
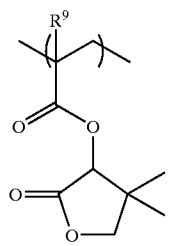 (77)
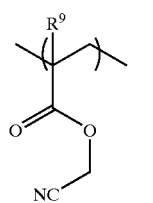 (78)
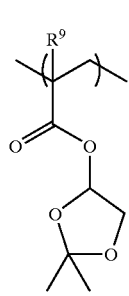 (79)

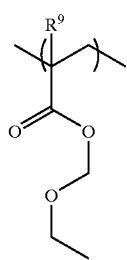 (80)
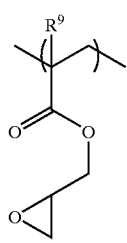 (81)
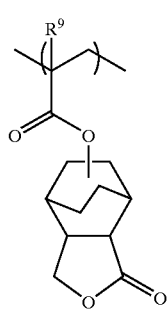 (82)
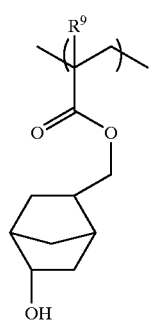 (83)
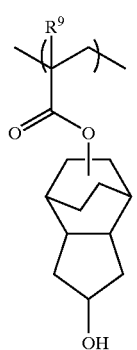 (84)
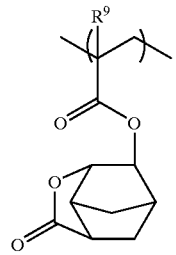 (85)
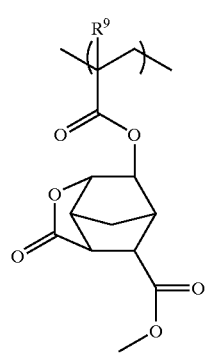 (86)
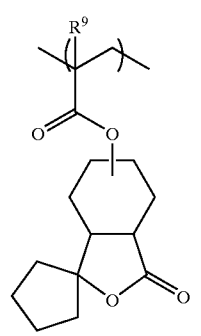 (87)
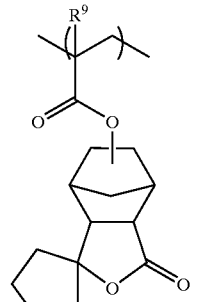 (88)
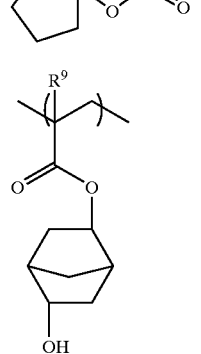 (89)

-continued
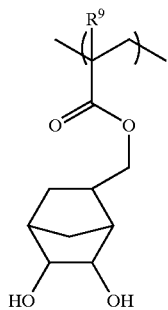
(90)
wherein $R^9$ is hydrogen, a straight, branched or cyclic $C_{1-20}$ alkyl group, or $CH_2CO_2R^{12}$, and $R^{12}$ is hydrogen or a straight, branched or cyclic $C_{1-20}$ alkyl group.
14. A polymer comprising recurring units of one of formula (2) to (5) and recurring units of (56) to (90):
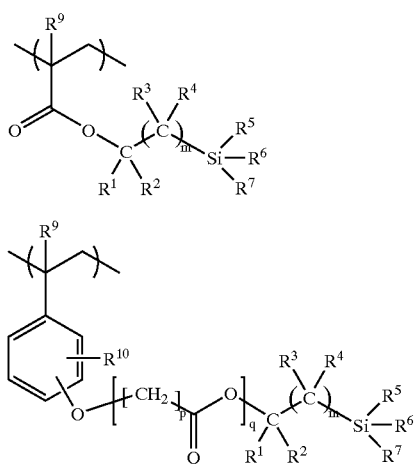
(2)
(3)
(4)
(5)
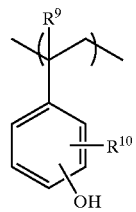
(53)
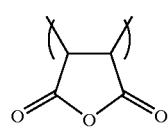
(54)
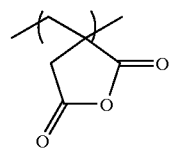
(55)
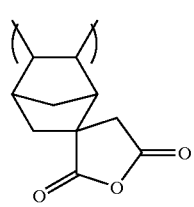
(56)
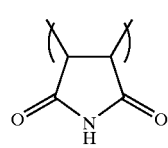
(57)
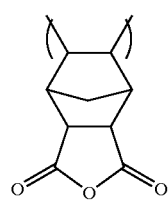
(58)
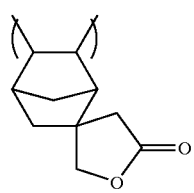
(59)
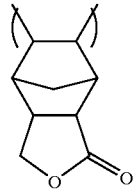
(60)

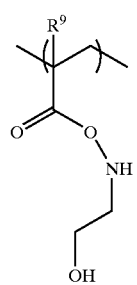
(61)
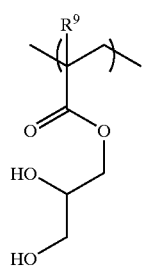
(62)
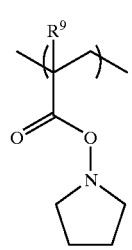
(63)
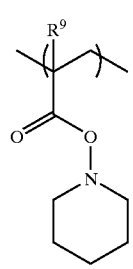
(64)
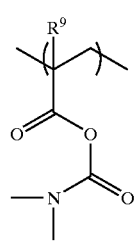
(65)
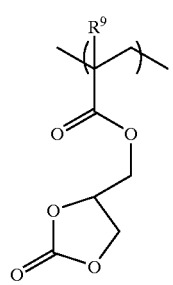
(66)
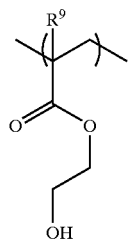
(67)
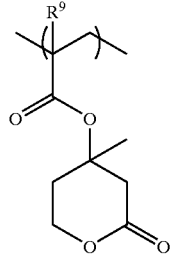
(68)
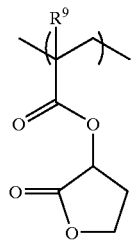
(69)
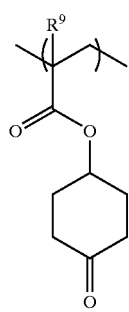
(70)
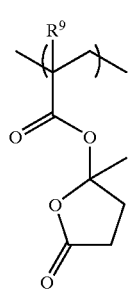
(71)
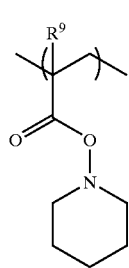
(72)

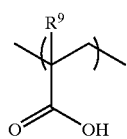 (73)
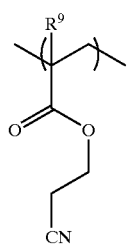 (74)
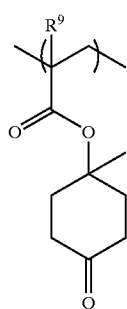 (75)
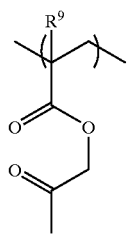 (76)
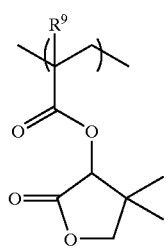 (77)
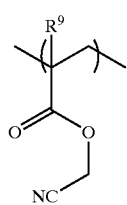 (78)
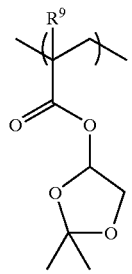 (79)
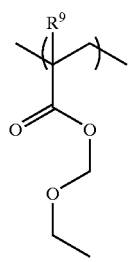 (80)
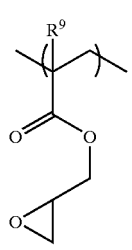 (81)
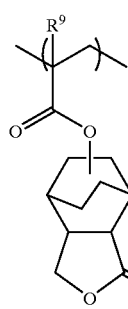 (82)
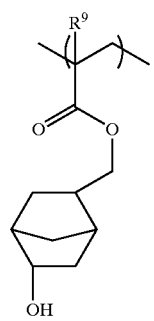 (83)

(84) 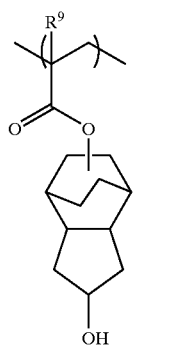

(85) 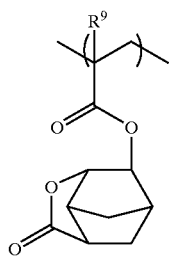

(86) 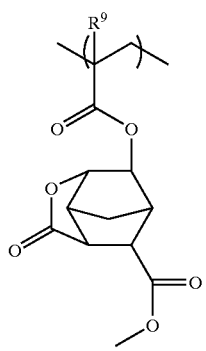

(87) 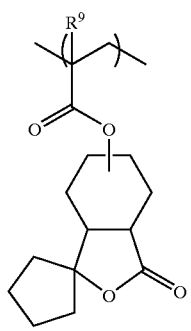

(88) 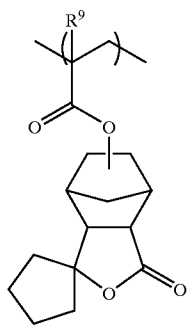

(89) 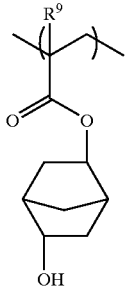

(90) 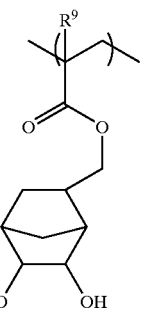

wherein wherein one of $R^1$ and $R^2$ is a cyclic alkyl group having 1 to 20 carbon atoms and the other is hydrogen or a straight, branched or cyclic alkyl group of 1 to 20 carbon atoms, or $R^1$ and $R^2$, taken together, optionally form an aliphatic hydrocarbon ring in which —$CH_2$— is optionally substituted by —$Si(R^8)_2$— group, and $R^3$ and $R^4$ are each independently hydrogen or a straight, branched or cyclic alkyl group of 1 to 20 carbon atoms, or $R^3$ and $R^4$, taken together, optionally form an aliphatic hydrocarbon ring in which —$CH_2$— is optionally substituted by —$Si(R^8)_2$—, $R^5$ to $R^7$ each are independently a straight, branched or cyclic alkyl or fluorinated alkyl group of 1 to 20 carbon atoms or an aryl group of 6 to 20 carbon atoms, $R^8$ is independently a straight or branched alkyl group of 1 to 4 carbon atoms, $R^9$ is hydrogen, a straight, branched or cyclic $C_{1-20}$ alkyl group, or $CH_2CO_2R^{12}$, $R^{10}$ is hydrogen or a straight, branched or cyclic $C_{1-20}$ alkyl group, $R^{11}$ is a straight, branched or cyclic $C_{1-10}$ alkylene group, $R^{12}$ is hydrogen or a straight, branched or cyclic $C_{1-20}$ alkyl group, m is 1 or 2, n is a number of 0 to 5, p is a number of 1 to 5, and each of q and r is 0 or 1.

15. A chemically amplified positive resist composition comprising:

(A) the polymer of claim 14, (B) a photoacid generator, and (C) an organic solvent.

16. A resist composition of claim 15, further comprising a basic compound.

17. A chemically amplified positive resist composition comprising:

(A) the polymer of claim 14, (B) a photoacid generator,
(C) an organic solvent, and
(D) a dissolution rate inhibitor having an acid labile group.

18. A resist composition of claim 17, further comprising a basic compound.

19. A monomer having a silicon-containing groups of formula (1):

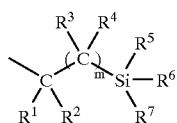
(1)

wherein one of $R^1$ and $R^2$ is a cyclic alkyl group having 1 to 20 carbon atoms and the other is hydrogen or a straight, branched or cyclic alkyl group of 1 to 20 carbon atoms, or $R^1$ and $R^2$, taken together, optionally form an aliphatic hydrocarbon ring in which —$CH_2$— is optionally substituted by —$Si(R^8)_2$— group, and $R^3$ and $R^4$ are each independently hydrogen or a straight, branched or cyclic alkyl group of 1 to 20 carbon atoms, or $R^3$ and $R^4$, taken together, optionally form an aliphatic hydrocarbon ring in which —$CH_2$— is optionally substituted by —$Si(R^8)_2$—, $R^5$ to $R^7$ each are independently a straight, branched or cyclic alkyl or fluorinated alkyl group of 1 to 20 carbon atoms or an aryl group of 6 to 20 carbon atoms, $R^8$ is independently a straight or branched alkyl group of 1 to 4 carbon atoms, and m is 1 or 2.

20. A monomer capable of forming units of one of formulae (2) to (5):

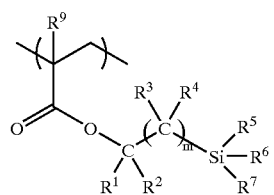
(2)

(3)

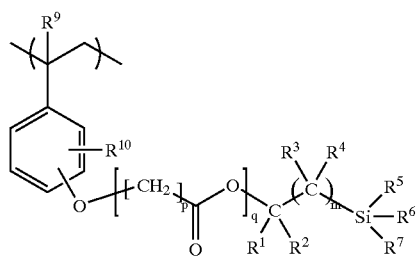

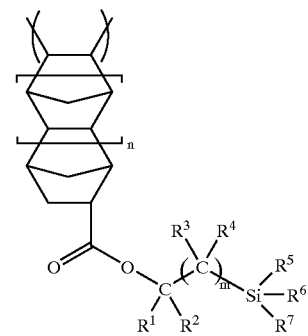
(4)

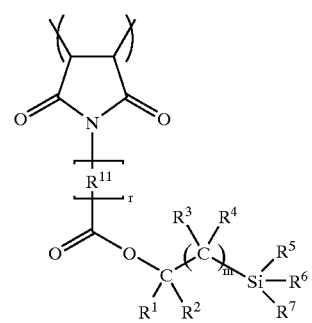
(5)

wherein
one of $R^1$ and $R^2$ is a cyclic alkyl group having 1 to 20 carbon atoms and the other is hydrogen or a straight, branched or cyclic alkyl group of 1 to 20 carbon atoms, or $R^1$ and $R^2$, taken together, optionally form an aliphatic hydrocarbon ring in which —$CH_2$— is optionally substituted by —$Si(R^8)_2$— group, and $R^3$ and $R^4$ are each independently hydrogen or a straight, branched or cyclic alkyl group of 1 to 20 carbon atoms, or $R^3$ and $R^4$ taken together, optionally form an aliphatic hydrocarbon ring in which —$CH_2$— is optionally substituted by —$Si(R^8)_2$—, $R^5$ to $R^7$ each are independently a straight, branched or cyclic alkyl or fluorinated alkyl group of 1 to 20 carbon atoms or aryl group of 6 to 20 carbon atoms, $R^8$ is independently a straight or branched alkyl group of 1 to 4 carbon atoms, $R^9$ is hydrogen, a straight, branched or cyclic alkyl group of 1 to 20 carbon atoms, or $CH_2CO_2R^{12}$, $R^{10}$ is hydrogen or a straight, branched or cyclic alkyl group of 1 to 20 carbon atoms, $R^{11}$ is a straight, branched or cyclic alkylene group of 1 to 10 carbon atoms, $R^{12}$ is hydrogen or a straight, branched or cyclic alkyl group of 1 to 20 carbon atoms, m is 1 or 2, n is a number of 0 to 5, p is a number of 1 to 5, each of q and r is 0 or 1.

* * * * *